United States Patent [19]

Okumoto et al.

[11] Patent Number: 5,234,304
[45] Date of Patent: Aug. 10, 1993

[54] METHOD AND APPARATUS FOR WORKPIECE INSTALLATION

[75] Inventors: Yutaka Okumoto; Kenji Koshiba; Hisao Suzuki; Kazuhiro Tokitsu; Makoto Kasahara; Kaoru Watanabe; Kiyoe Imai; Susumu Simada; Koichi Yumita, all of Tokyo; Takatomo Izume, Mie; Tadashi Munaakata, Tokyo; Yoshinobu Ishikawa, Tokyo; Akira Sawakata, Tokyo; Yasuharu Ujiie, Kanagawa, all of Japan

[73] Assignees: Japan Tobacco Inc.; Kabushiki Kaisha Toshiba, both of Tokyo, Japan

[21] Appl. No.: 674,887

[22] Filed: Mar. 26, 1991

[30] Foreign Application Priority Data

| Mar. 26, 1990 | [JP] | Japan | 2-073415 |
| Mar. 26, 1990 | [JP] | Japan | 2-073416 |
| Feb. 1, 1991 | [JP] | Japan | 3-011995 |
| Feb. 1, 1991 | [JP] | Japan | 3-012005 |
| Feb. 1, 1991 | [JP] | Japan | 3-012007 |
| Feb. 4, 1991 | [JP] | Japan | 3-013232 |
| Feb. 4, 1991 | [JP] | Japan | 3-013233 |

[51] Int. Cl.⁵ .............................. B65H 5/18
[52] U.S. Cl. .................. 414/225; 198/471.1; 198/476.1; 198/475.1; 29/740; 29/741; 414/786
[58] Field of Search ............ 414/225, 223, 744.2, 414/737, 786; 901/40; 198/471.1, 475.1, 476.1, 377; 29/740, 741, 739

[56] References Cited

U.S. PATENT DOCUMENTS

| 3,490,575 | 1/1970 | Herrmann | 198/377 |
| 3,877,569 | 4/1975 | Shields | 198/377 |
| 4,620,359 | 11/1986 | Charlton et al. | 414/223 X |
| 4,643,633 | 2/1987 | Lashyro | 414/737 X |
| 4,807,350 | 2/1989 | Hasenkamp | 414/744.2 |
| 4,809,430 | 3/1989 | Maruyama et al. | |
| 4,951,388 | 8/1990 | Eguchi et al. | 29/740 X |

FOREIGN PATENT DOCUMENTS

| 0315799 | 5/1989 | European Pat. Off. |
| 62-114290 | 5/1987 | Japan. |

Primary Examiner—Michael S. Huppert
Assistant Examiner—Donald W. Underwood
Attorney, Agent, or Firm—Oblon, Spivak, McClelland, Maier & Neustadt

[57] ABSTRACT

A method and an apparatus for workpiece installation capable of carrying out workpiece installation operation without a stopping of a rotational motion of a rotatable table member. In the apparatus, rotatable drum is continuously rotated while workpiece carrier member, provided along a circumference of the rotatable drum, for carrying a workpiece from a workpiece supply station to a workpiece installation station, which is capable of spinning on the circumference while carrying the workpiece, is controlled such that the workpiece carrier member spins while the rotatable drum rotates so as to move along a prescribed trajectory which is preferably a cycloidal or quasi-cycloidal trajectory, and that the workpiece is picked up by the workpiece carrier member at a prescribed pick-up position on the workpiece supply station and released at a prescribed installation position on the workpiece installation station.

16 Claims, 23 Drawing Sheets

METHOD AND APPARATUS FOR WORKPIECE INSTALLATION

BACKGROUND OF THE INVENTION

1. Field of the Invention

The present invention relates to a method and an apparatus for installation of workpieces, such as that of electronic component chips on a printed circuit board.

2. Description of the Background Art

As an example of a conventional workpiece installation apparatus for installing electronic component chips on a printed circuit board, there is one disclosed in Japanese Patent Application Laid Open No. 62-114290 (1887).

This workpiece installation apparatus has a plurality of vertically movable suction heads arranged along a circumference of a rotatable table, around which a suction station and an installation station are located, where the electronic component chips are installed as follows.

First, the rotation of the rotatable table is stopped such that one suction head is located over the suction station, and then the suction head is vertically lowered to hold the electronic component chip placed on the suction station. Then, the suction head holding the electronic component chip is vertically lifted and the rotatable table is rotated for a predetermined angle such that the suction head holding the electronic component chip is located over the installation station, and then the suction head is vertically lowered to release the electronic component chip onto the printed circuit board placed on the installation station. This installation operation is repeated for the other suction heads as many times as necessary.

In such a conventional workpiece installation apparatus, the rotatable table must repeat intermittent rotational motion in which the rotation of the rotatable table must be stopped during the holding and releasing of the workpiece, so that the efficiency of the installation operation is limited by the loss time due to the stopping of the rotation of the rotatable table.

Also, in a conventional workpiece installation apparatus, the movement of the workpieces between predetermined positions of the suction station and installation station is realized by controlling the suction heads and the rotatable table by using mechanical links.

SUMMARY OF THE INVENTION

It is therefore an object of the present invention to provide a method and an apparatus for workpiece installation capable of carrying out workpiece installation operation without a stopping of a rotational motion of a rotatable table member.

It is also an object of the present invention to provide such a method and an apparatus capable of installing the workpieces more accurately.

It is also an object of the present invention to provide such a method and an apparatus capable of holding the workpieces more accurately.

It is also an object of the present invention to provide such a method and an apparatus capable of controlling the movement of the workpieces more accurately.

According to one aspect of the present invention there is provided a workpiece installation apparatus, comprising: rotatable drum means for continuously rotating around a fixed axis; workpiece carrier means, provided along a circumference of the rotatable drum means, for carrying a workpiece from a workpiece supply station to a workpiece installation station, capable of spinning on the circumference while carrying the workpiece; and control means for controlling the workpiece carrier means such that the workpiece carrier means spins while the rotatable drum means rotates so as to move along a prescribed trajectory, and that the workpiece is picked up by the workpiece carrier means at a prescribed pick-up position on the workpiece supply station and released at a prescribed installation position on the workpiece installation station.

According to another aspect of the present invention there is provided a method of workpiece installation, comprising the steps of: continuously rotating rotatable drum means around a fixed axis; providing workpiece carrier means along a circumference of the rotatable drum means, for carrying a workpiece from a workpiece supply station to a workpiece installation station, capable of spinning on the circumference while carrying the workpiece; controlling the workpiece carrier means such that the workpiece carrier means spins while the rotatable drum means rotates so as to move along a prescribed trajectory, and that the workpiece is picked up by the workpiece carrier means at a prescribed pick-up position on the workpiece supply station and released at a prescribed installation position on the workpiece installation station.

Other features and advantages of the present invention will become apparent from the following description taken in conjunction with the accompanying drawings.

DETAILED DESCRIPTION OF THE PREFERRED EMBODIMENTS

Figure 1:
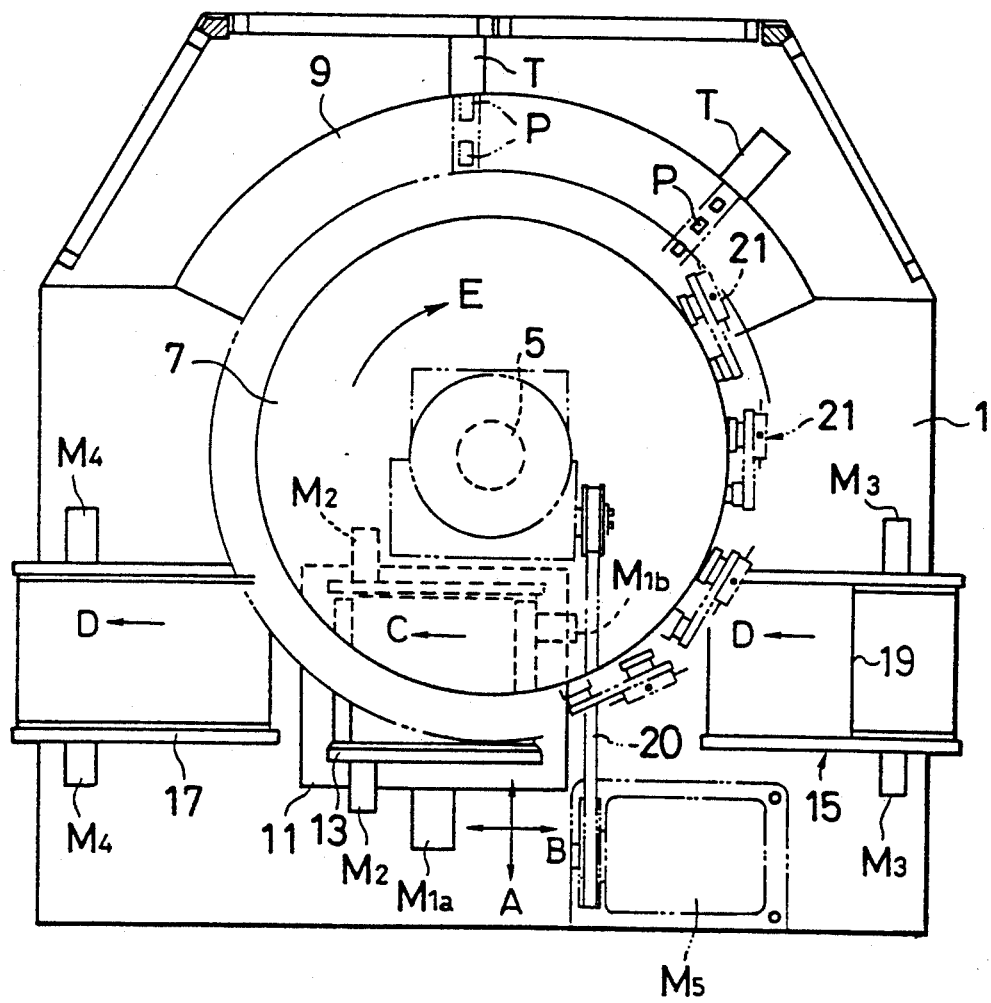
FIG. 1 is a schematic top plan view of the first embodiment of a workpiece installation apparatus according to the present invention.

Referring now to FIG. 1 to FIG. 7, the first embodiment of a workpiece installation apparatus according to the present invention will be described.

In this first embodiment, the workpiece installation apparatus comprises: a main body 1; a rotatable drum shaft 5 provided in a middle of the main body 1; a rotatable drum 7 attached to the rotatable drum shaft 5, which has a plurality of workpiece holding members 21 along its circumference; a supply table 9 formed along a part of an outer circumference of the rotatable drum 7, which functions as a suction station for supplying workpieces P to be installed to the workpiece holding members 21; and a movable XY table 11 which is located on an opposite side of the rotatable drum 7 from the supply table 9 and which functions as an installation station for installing the workpieces P on the printed circuit board.

The supply table 9 has a semi-circular shape along the circumference of the rotatable drum 7, and is equipped with a plurality of feeders T which feed the workpieces P such as electronic component chips to the suction positions in radial direction of the rotatable drum 7.

The XY table 11 is movable in directions of an arrow A (front-back) and an arrow B (right-left) by using first motors M1a and M1b, respectively. On this XY table 11, there is provided an installation conveyer 13 for carrying printed circuit board in a direction of an arrow C by using second motors M2. The printed circuit board is supplied to the installation conveyer 13 from a send-in conveyer 15 for sending the printed circuit board in a direction of the arrow D by using third motors M3, to which the installation conveyer 13 approaches when the XY table 11 moved to the right, and then the printed circuit board with the electronic component chips installed is sent out from the installation conveyer 13 to a send-out conveyer 17 for sending the printed circuit board in a direction of the arrow D by using a fourth motors M4, to which the installation conveyer 13 approaches when the XY table 11 moved to the left.

The rotatable drum 7 is rotated in a direction of an arrow E continuously by the driving power supplied from the fifth motor M5 through a transmission belt 20 connecting the fifth motor M5 and the rotatable drum shaft 5.

Each of the workpiece holding member 21 comprises a rotatable head 25 having four suction nozzles 23 of different sizes which are arranged on four sides of the rotatable head 25 with 90 degrees separation between neighboring ones; and a link mechanism 27 and a planetary gear train to be described below for rotating the rotatable head 25 without changing its orientation.

Figure 2:
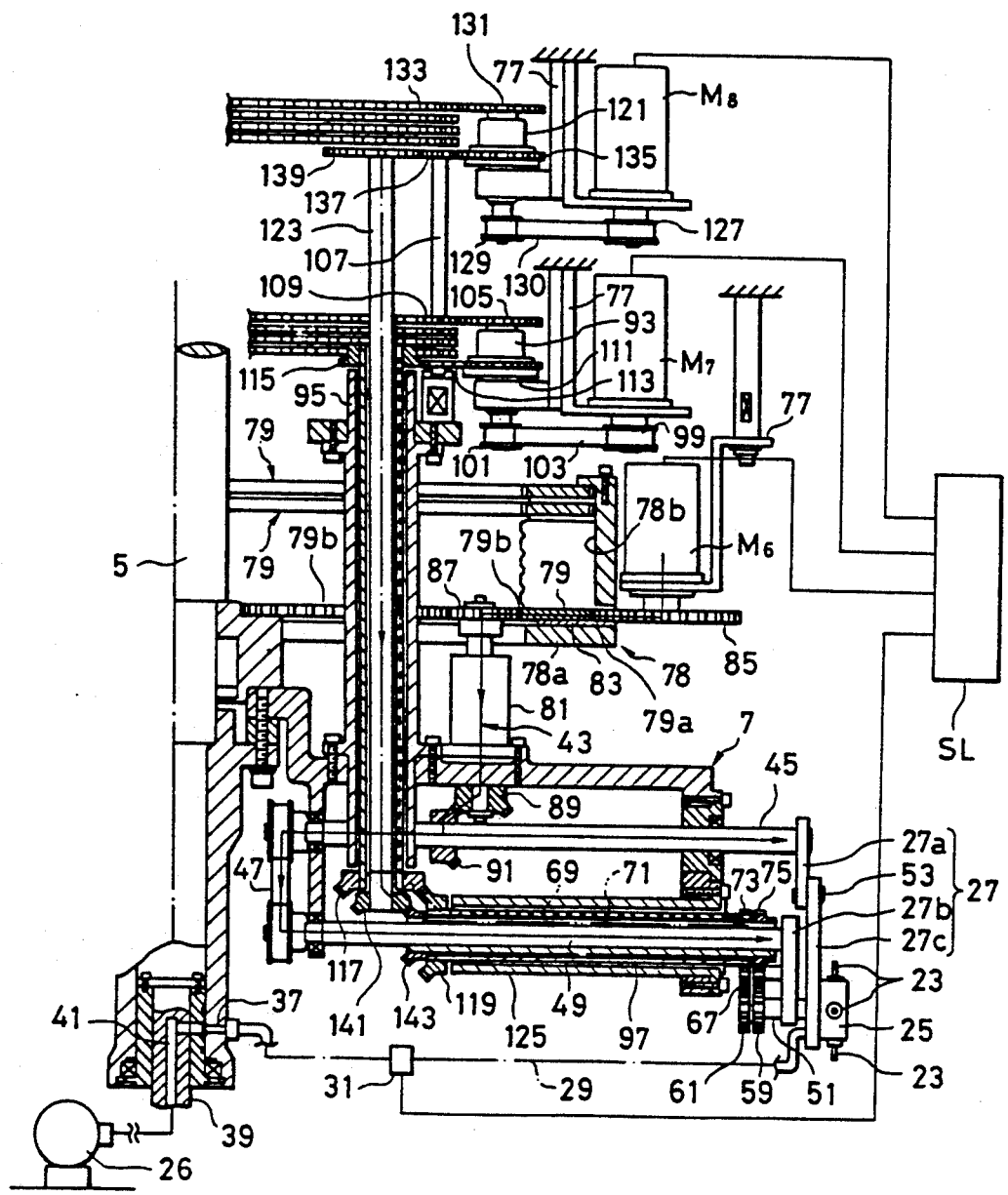
FIG. 2 is a schematic cross sectional view of a main portion of the workpiece installation apparatus of FIG. 1

As shown in detail in FIG. 2, the suction nozzles 23 are connected with a vacuum pump 26 through a pipe 29, and the holding and releasing by the suction nozzles 23 can be controlled by controlling the suction power due to the vacuum pressure with the opening and closing of a valve 31 provided on the pipe 29.

The pipe 29 and the valve 31 rotate in conjunction with the rotation of the rotatable drum 7, and one end of the pipe 29 is connected with the vacuum pump 26 through an outlet port 37 provided near a lower end of the rotatable drum shaft 5 and a communication path 41 provided in a fixed shaft 39 and having a ring shaped opening such that the vacuum pump 26 and the pipe 29 can be connected even when the outlet port 37 is rotated.

The link mechanism 27 comprises a first link 27a; a second link 27b; and a third link 27c. The first link 27a is attached to a first link shaft 45 which forms a part of a first transmission path 43, so that it can be rotated along with the first link shaft 45. The second link 27b is attached to a second link shaft 49 connected with the first link shaft 45 through a transmission belt 47, so that it can be rotated along with the second link shaft 49. The third link 27c has one end rotatably connected to the first link 27a by a pin 53, while the other end attached to a third link shaft 51 which rotates around the second link shaft 49 and rotatably supported by the second link 27b.

Figure 4:
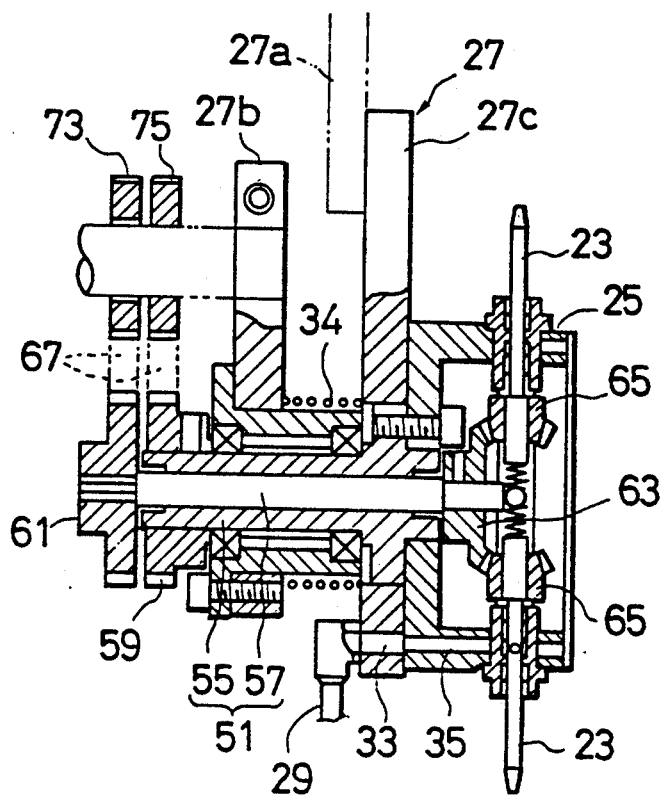
FIG. 4 is a detail cross sectional view of a rotatable head portion of the workpiece installation apparatus of FIG. 1.

As shown in FIG. 4, this third link 27c is attached to the rotatable head 25 by being pressed against the rotatable head 25 by means of a spring 34, and has a connecting hole 33 for connecting one end of the pipe 29 with a path 35 provided behind the suction nozzles 23 even when the rotatable head 25 is rotated in order to selectively activate one of the suction nozzles 23 connected with the path 35.

Figure 5:
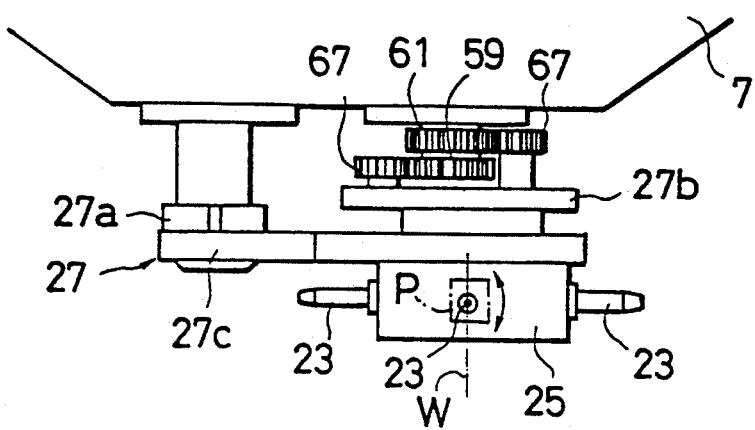
FIG. 5 is a detail top plan view of a rotatable head portion of the workpiece installation apparatus of FIG. 1.

The third link shaft 51 comprises an outer shaft 55 and an inner shaft 57. The outer shaft 55 is connected with the rotatable head 25 on one end and a rotatable head driving gear 59 one the other end such that the rotatable head 25 can be rotated by 90 degrees as the driving power is transmitted to the rotatable head driving gear 59. The inner shaft 57 is connected with a suction nozzle driving gear 61 on one end and a side gear 63 on the other end, where the side gear 63 is engaged with a pinion gear 65 attached to the basis of the suction nozzles 23. Thus, the driving power is transmitted from the suction nozzle driving gear 61 through the side gear 63 and the pinion gear 65 to rotate the suction nozzles 23 to adjust an orientation angle of each suction nozzle 23 with respect to a line W to which the workpiece P is to be aligned, as shown in FIG. 5.

The suction nozzle driving gear 61 and the rotatable head driving gear 59 are engaged with the final gears 73 and 75 of the second and third transmission paths 69 and 71 through a pair of intermediate gears 67 rotatably supported by the second link 27b, to form the planetary gear train comprising the gears 59, 61, 67, 73 and 75 which rotate around the second link shaft 49. Here, the final gears 73 and 75, suction nozzle driving gear 61, and the rotatable head driving gear 59 may be replaced by pulleys or sprockets connected by belts or chains.

The gear ratio of the rotatable head driving gear 59 and the suction nozzle driving gear 61 with respect to the final gears 73 and 75 is set equal to 1:1. Also, a distance between the first link shaft 45 and the pin 53 and a distance between the second link shaft 49 and the third link shaft 51 is made to be substantially equal to each other.

By means of the rotational motions of the first, second and third links 27a, 27b, and 27c around the first and second link shafts 45 and 49, and the action of the planetary gear train, the rotatable head 25 maintains a constant orientation in which the selected one of the suction nozzles 23 is pointing downward, and the connecting hole 33 and the path 35 is communicating, while rotating.

The first transmission path 43 is a transmission system for providing the driving power from a sixth motor M6 attached to the main body 1 by a bracket 77, and from the rotatable drum 7 to the first and second link shafts 45 and 49 through a ring gear 79 and an input side gear 87.

The ring gear 79 is equipped with an outer gear 79a on its outside and an inner gear 79b on its inside and rotatably mounted on an inner flange portion 78a of a fixed flame 78. The outer gear 79a is engaged with the motor gear 85 of the sixth motor M6 in a state of being appropriately positioned on an upper face of the inner flange portion 78a by means of a ring member 83 which makes contact with the inner wall face 78b of the fixed flame 78 provided on the lower face side of the ring gear 79. The inner gear 79b is engaged with the input side gear 87 of the gear shaft 81 supported by the rotatable drum 7, and the output side gear 89 of the gear shaft 81 is engaged with the transmission gear 91 attached to the first link shaft 45.

Thus, when the sixth motor M6 is off and the rotatable drum 7 rotates in the direction of the arrow E, the input side gear 87 rotates while spinning around itself in a state of being engaged with the ring gear 79, the rotational driving power is transmitted from the input side gear 87 to the first and second link shafts 45 and 49 through the output side gear 89 and the transmission gear 91 as the rotational driving power into a counterclockwise direction. As a result, the suction nozzles 23 of the rotatable head 25 repeat the pick-up motion of moving up and down along a trajectory of a cycloidal curve N shown in FIG. 3.

Here, by rotating the ring gear 79 into the same direction as the rotatable drum 7 by controlling the operation of the sixth motor M6 while the rotatable drum 7 is rotating, the period of the pick-up motion of the suction nozzles 23 can be made longer.

Figure 3:
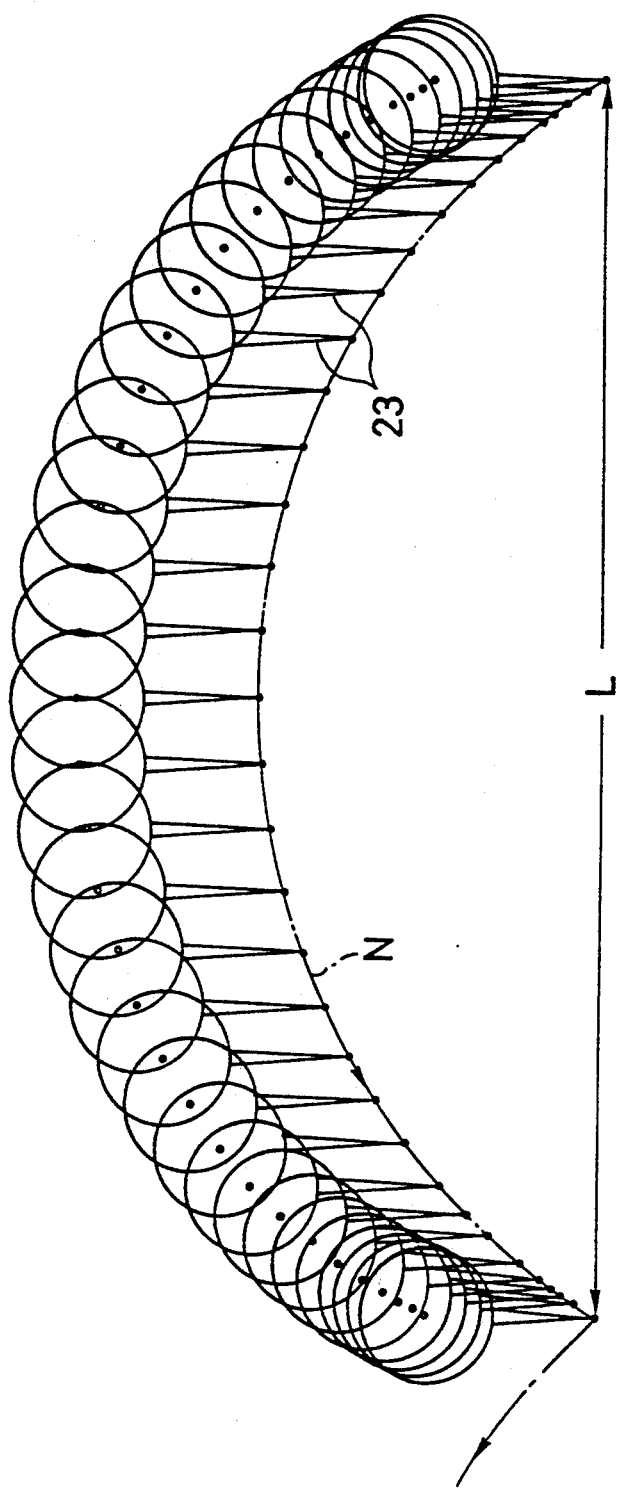
FIG. 3 is an illustration of a cycloidal trajectory for a workpiece holding member in the workpiece installation apparatus of FIG. 1.

More specifically, in this embodiment, the suction nozzle 23 pointing downward is going to rotate in the counter-clockwise direction for approximately 5 times while moving from the supply table 9 to the XY table 11 by the 180 degrees rotation of the rotatable drum 7, so that the pick-up motion along the trajectory of the cycloidal curve in which the suction nozzle 23 is lowered twice during one cycle L as shown in FIG. 3 can be obtained by controlling the sixth motor M6 for 4 rotations. In this pick-up motion, the rotation rate is set equal to such a value that the speed of the top end of the suction nozzle 23 due to the rotation of the rotatable drum 7 in the direction of the arrow E and the speed of the top end of the suction nozzle 23 due to the rotation of the rotatable head 25 in the counter-clockwise direction are going to coincide with each other, so that the suction nozzle 23 has a net relative speed with respect to the ground equal to approximately zero. As a result, the stable suction operation can be achieved in this embodiment, and by controlling the operation of the sixth motor M6 differently such as for 3 rotations or 4.5 rotations, the one cycle L of the cycloidal curve N can be lengthen or shorten, so that the pick-up motion of the suction nozzle 23 can be carried out with respect to the entire region of the supply table 9.

Here, the driving power for the pick-up motion of the suction nozzles 23 can be provided differently. For example, the as shown by a dashed line enclosed portion in FIG. 7, the configuration may be changed such that the outer gear 79a of the ring gear 79 is engaged with the input side gear 87 and the inner gear 79b is engaged with the motor gear 85 of the sixth motor M6. Also, as shown by a double dot chain line enclosed portion in FIG. 7, the transmission system of the dashed line enclosed portion can be replaced by the configuration in which the input side gear 87 is directly engaged with the horizontally rotating ring gear 80 to form a connection with the first transmission path 43.

The second transmission path 69 is a transmission system for the orientation angle of the suction nozzles 23 which shuts off the driving power from the rotatable drum 7 while providing the driving power from a seventh motor M7 attached to the main body 1 by a bracket 77 to the final gear 73 through a differential gear 93, an elongated sleeve shaft 95, and an outer sleeve shaft 97 located outside of the second link shaft 49.

The motor pulley 99 of the seventh motor M7 is connected with the pulley 101 of the differential gear 93 through a transmission belt 103, and the first gear 105 of the differential gear 93 is engaged with a ring shaped fixed gear 109 which is fixed integrally to the fixed shaft 107 supported by the rotatable drum 7, while the second gear 111 of the differential gear 93 is engaged with a ring shaped free gear 113 which is freely pierced through the fixed shaft 107, and the free gear 113 is engaged with the transmission gear 115 provided on an upper edge of the sleeve shaft 95. In this configuration, the numbers of teeth for the differential gear 93 and the gears 109, 105, 111, and 113 are set equal to such values that the ratio of the speed of the fixed gear 109 and the free gear 113 is going to be 1:1.

As a result, the driving power from the fixed gear 109 which rotates along with the rotatable drum 7 can be transmitted to the free gear 113 through the first and second gears 105 and 111 of the differential gear 93, but at the same time the rotations of the fixed gear 109 and the free gear 113 are synchronized such that the driving power transmission to the sleeve shaft 95 is shut off.

On the other hand, the bevel gear 117 provided at the lower edge of the sleeve shaft 95 is engaged with the bevel gear 119 provided on the outer sleeve shaft 97. Thus, when the seventh motor M7 is operating, its rotational driving power can be transmitted to the final gear 73 through the second gear 111, free gear 113, sleeve shaft 95, and outer sleeve shaft 97.

The third transmission path 71 is a transmission system for selecting one of the suction nozzles 23 which shuts off the driving power from the rotatable drum 7 while providing the driving power from an eighth motor M8 attached to the main body 1 by a bracket 77 to the final gear 75 through a differential gear 121, a transmission shaft 123 piercing through the sleeve shaft 95, and an inner sleeve shaft 125 located outside of the second link shaft 49.

The motor pulley 127 of the eighth motor M8 is connected with the pulley 129 of the differential gear 121 through a transmission belt 130, and the first gear 131 of the differential gear 121 is engaged with a ring shaped fixed gear 133 which is fixed integrally to the fixed shaft 107, while the second gear 135 of the differential gear 121 is engaged with a ring shaped free gear 137 which is freely pierced through the fixed shaft 107, and the free gear 137 is engaged with the transmission gear 139 provided on an upper edge of the transmission shaft 123. In this configuration, the numbers of teeth for the differential gear 121 and the gears 133, 131, 135, and 137 are set equal to such values that the ratio of the speed of the fixed gear 113 and the free gear 137 is going to be 1:1.

As a result, the driving power from the fixed gear 133 which rotates along with the rotatable drum 7 can be transmitted to the free gear 137 through the first and second gears 131 and 135 of the differential gear 121, but at the same time the rotations of the fixed gear 133 and the free gear 137 are synchronized such that the driving power transmission to the transmission shaft 123 is shut off.

On the other hand, the bevel gear 141 provided at the lower edge of the transmission shaft 123 is engaged with the bevel gear 143 provided on the inner sleeve shaft 125. Thus, when the eighth motor M8 is operating, its rotational driving power can be transmitted to the final gear 75 through the second gear 135, free gear 137, transmission shaft 123, and inner sleeve shaft 125.

In addition, as shown in FIG. 2, there is provided a control unit SL to which information is inputted from various sensors such as a workpiece monitoring sensor for checking a state in which the workpiece is held by the suction nozzles 23, and a rotation angle sensor for detecting an angle of rotation of the rotatable drum 7, and which outputs control signals to control the opening and closing of the valve 31 and the starting and stopping of the first to eighth motors M1 to M8 appropriately in accordance with the inputted information.

Now, the operation of this workpiece installation apparatus of the first embodiment will be described.

Figure 6:
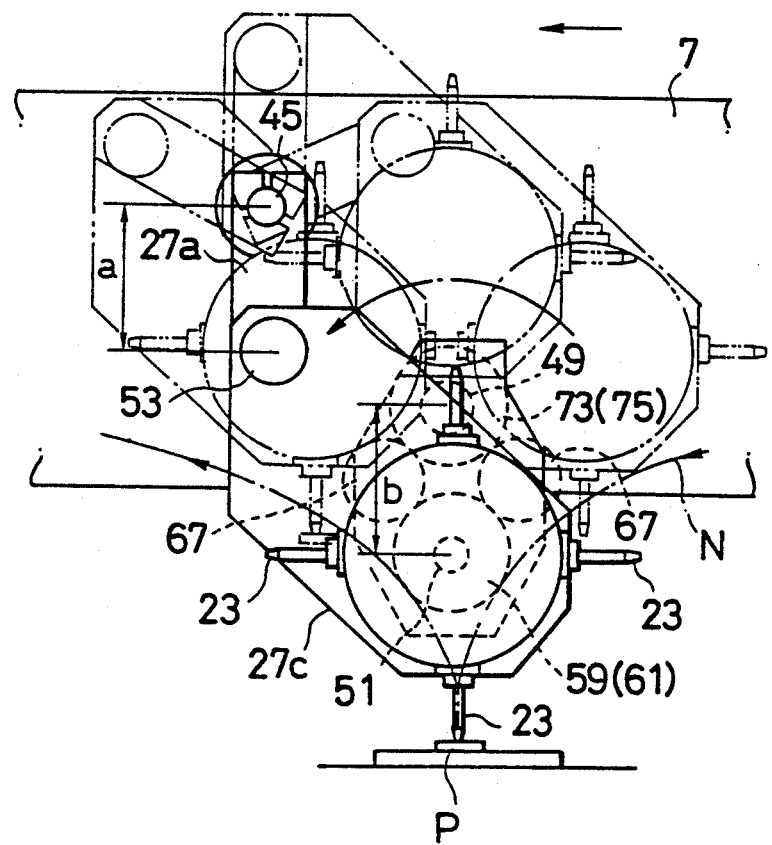
FIG. 6 is a detail illustration of a motion of the rotatable head of the workpiece installation apparatus of FIG. 1.
Figure 7:
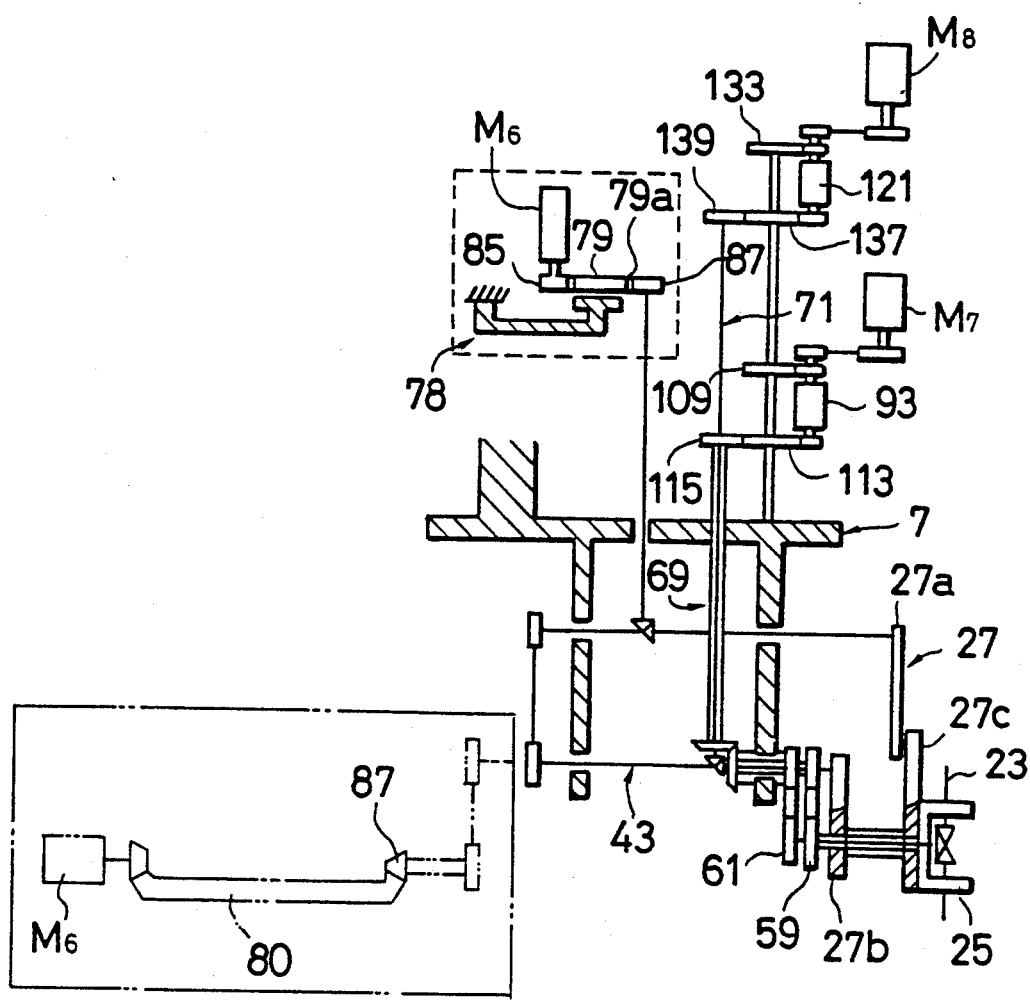
FIG. 7 is a cross sectional view of an alternative configuration for a pick-up motion driving section of the workpiece installation apparatus of FIG. 1.

With respect to the rotatable drum 7 which is continuously rotating in the direction of the arrow E, the suction nozzle 23 pointing downward continues to rotate in the counter-clockwise direction as shown in FIG. 6. Here, the suction nozzles 23 repeat the pick-up motion along the cycloidal trajectory N shown in FIG. 3 of a relatively long period L according to the control by the control unit SL. In this pick-up motion, the relative speed of the suction nozzles 23 with respect to the ground becomes substantially equal to zero at the lowered position, so that the picking up of the workpiece P from the supply table 9 can be achieved stably. Then, the suction nozzles 23 holding the workpieces P is rotated around to the XY table 11 while repeating the pick-up motion along the cycloidal trajectory, and release the workpieces P on the printed circuit board 19 on the XY table 11 to install the workpieces P.

Here, by controlling the seventh motor M7 so as to transmit the driving power to the final gear 73 through the second transmission path 69 in order to adjust the orientation angle of the suction nozzles 23, the accurate installation of the workpieces P on the printed circuit board 19 can be achieved.

Also, by controlling the eighth motor M8 so as to transmit the driving power to the final gear 75 through the third transmission path 71 in order to rotate the rotatable head 25 by 90 degrees, the selection of the appropriate one of the suction nozzles 23 in accordance with the size of the workpiece P can be achieved.

In this embodiment, the rotatable drum 7 maintains the continuous rotation throughout the operation of the apparatus, so that there is a no time loss due to the stopping of the rotatable drum 7.

Moreover, by controlling the period L of the cycloidal trajectory N of the pick-up motion of the suction nozzles 23, the workpieces P can be picked up over the entire region of the supply table 9, and then the workpieces P can be installed on the printed circuit board 19 on the XY table 11 without stopping the rotation of the rotatable drum 7, so that the efficiency in the process of workpiece installation can be improved.

Referring now to FIG. 8 to FIG. 12, the second embodiment of a workpiece installation apparatus according to the present invention will be described. In the following, those elements which has the corresponding elements in the first embodiment described above will be given the same reference numerals in the drawings and their description will generally be omitted.

In this second embodiment, each of the workpiece holding member 21 comprises a rotatable head 25 having four suction nozzles 23 of different sizes which are arranged on four sides of the rotatable head 25 with 90 degrees separation between neighboring ones; and a head orientation control mechanism 145 for rotating the rotatable head 25 without changing its orientation.

Figure 8:
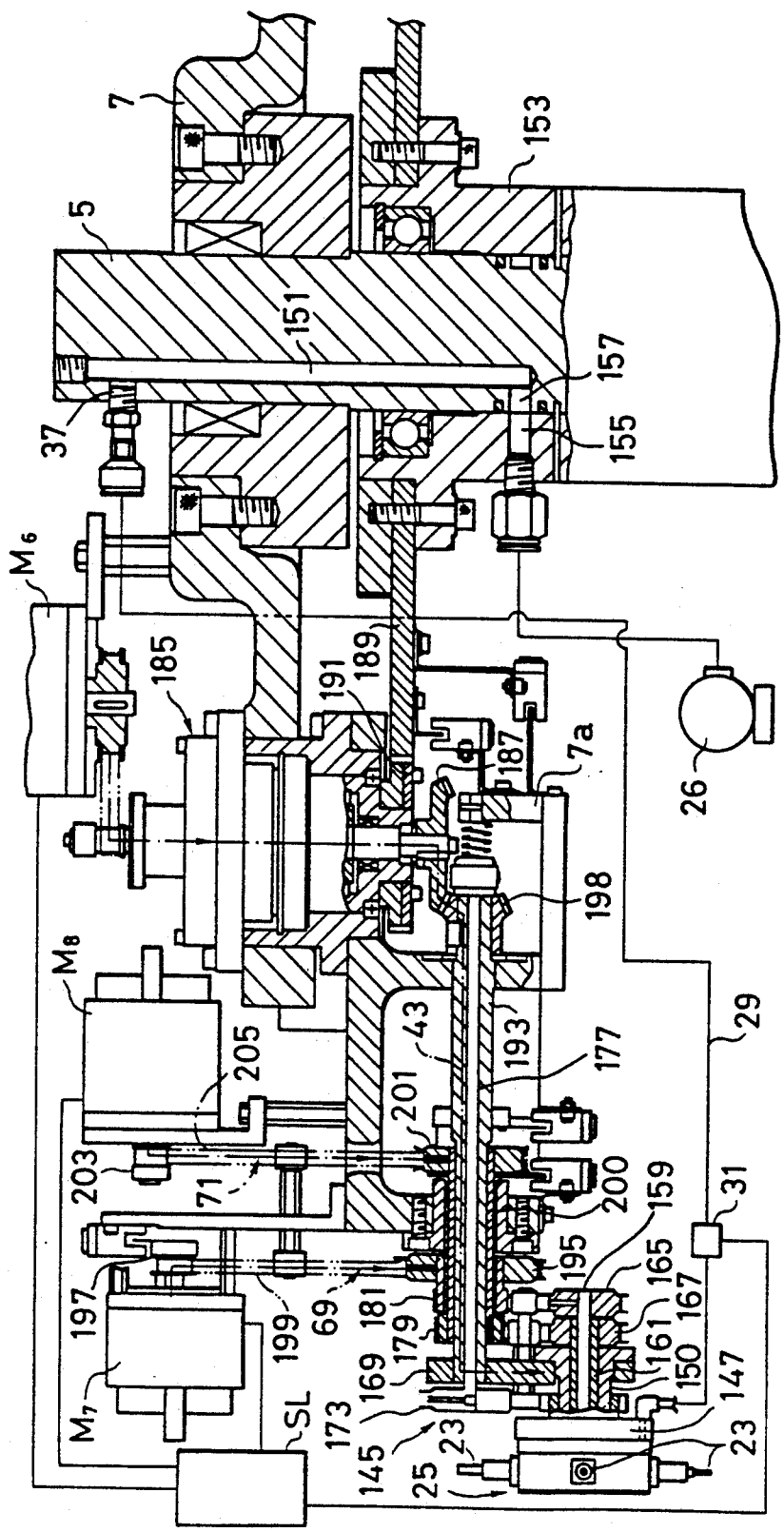
FIG. 8 is a schematic cross sectional view of a main portion of the second embodiment of a workpiece installation apparatus according to the present invention.
Figure 9:
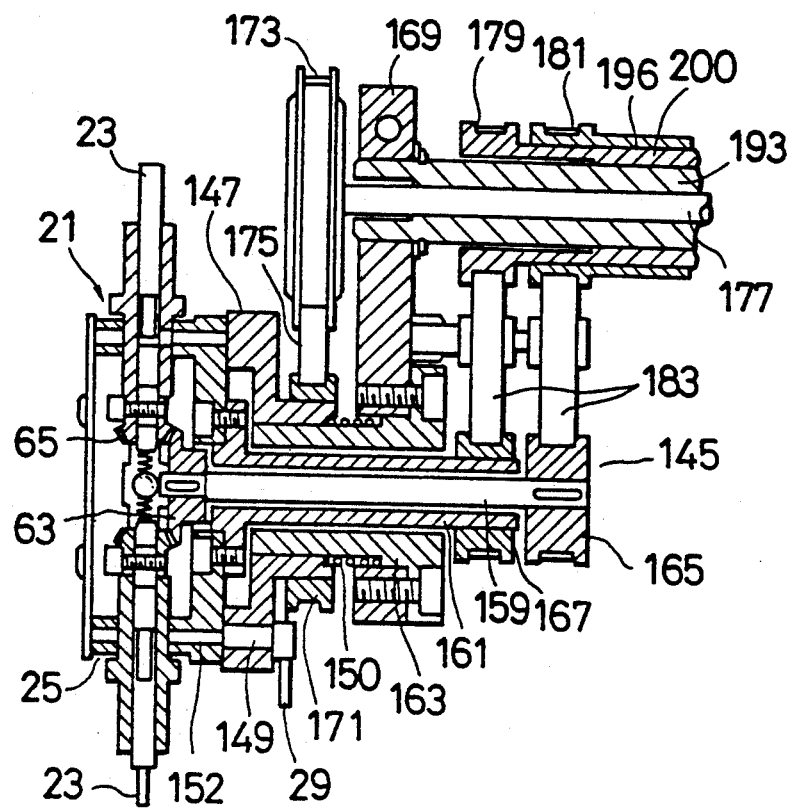
FIG. 9 is a detail cross sectional view of a rotatable head portion of the workpiece installation apparatus of FIG. 8.

As shown in detail in FIG. 8, the suction nozzles 23 are connected with a vacuum pump 26 through a pipe 29, and the holding and releasing by the suction nozzles 23 can be controlled by controlling the suction power due to the vacuum pressure with the opening and closing of a valve 31 provided on the pipe 29.

The pipe 29 and the valve 31 rotate in conjunction with the rotation of the rotatable drum 7, and one end of the pipe 29 is connected with a connecting hole 149 on a circular member 147 contacting the back side of the rotatable head 25. The circular member 147 is attached to the rotatable head 25 by being pressed against the rotatable head 25 by means of a spring 150 such that the connecting hole 149 is connected with the path 152 provided behind the suction nozzles 23 even when the rotatable head 25 is rotated in order to selectively activate one of the suction nozzles 23.

The other end of the pipe 29 is connected with the vacuum pump 26 through an outlet port 37 provided near n upper end of the rotatable drum shaft 5 and a communication path 151 provided in a rotatable drum shaft 5. The lower end of the communication path 151 has a ring shaped outlet port 157 communicated with the path 155 of the fixed sleeve 153 connected to the vacuum pump 26 such that the outlet port 157 and the path 155 can be connected even when the rotatable drum shaft 5 is rotated.

The head orientation control mechanism 145 comprises a link 169 fixed to the sleeve shaft 193, the first shaft 159, second shaft 161, and third shaft 163 which are rotated around the sleeve shaft 193 by the link 169.

Figure 10:
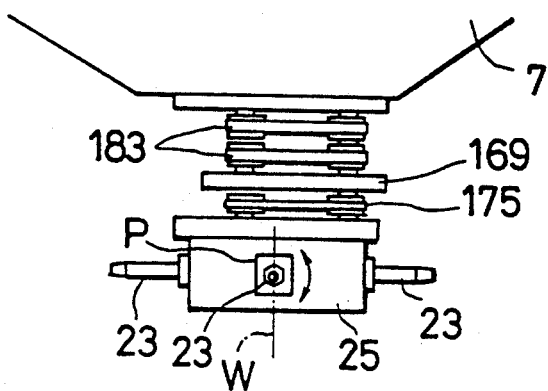
FIG. 10 is a detail top plan view of a rotatable head portion of the workpiece installation apparatus of FIG. 8.

The first shaft 159 is provided inside the second shaft 161 in freely rotatable state, and has one end attached to the suction nozzle driving pulley 165 and the other end attached to the side gear 63, where the side gear 63 is engaged with the pinion gear 65 provided at the basis of the suction nozzles 23. Thus, the driving power is transmitted from the suction nozzle driving pulley 165 through the side gear 63 and the pinion gear 65 to rotate the suction nozzles 23 to adjust an orientation angle of each suction nozzle 23 with respect to a line W to which the workpiece P is to be aligned, as shown in FIG. 10.

The second shaft 161 is provided inside the third shaft 163 in freely rotatable state, and has one end attached to the rotatable head 25 and the other end attached to the rotatable head driving pulley 167. Thus, by applying the driving power to the rotatable head driving pulley 167, the rotatable head 25 can be rotated and the appropriate one of the suction nozzles 23 can be selected.

The third shaft 163 is the outermost shaft and has one end fixed to the link 169 and the other end inserted into the extended opening portion of the circular member 147 in a freely rotatable state, where the extended opening portion of the circular member 147 has a pulley 171 attached. This pullet 171 is connected with the final pulley 173 fixed to the fixed shaft 177 through the belt 175.

The fixed shaft 177 has one end supported by the sleeve shaft 193 which is inserted into the link 169, and the other end fixed to the support flame 7a fixed to the rotatable drum 7.

The suction nozzle driving pulley 165 and the rotatable head driving pulley 167 are connected with the final pulleys 181 and 179 of the second and third transmission paths 69 and 71 through the belt 183, such that a planetary train in which the rotatable head 25 rotates while spinning around itself as the link 169 is rotated by the first transmission path 43 in a state in which the final pulleys 181 and 179 are stopping.

Figure 12:
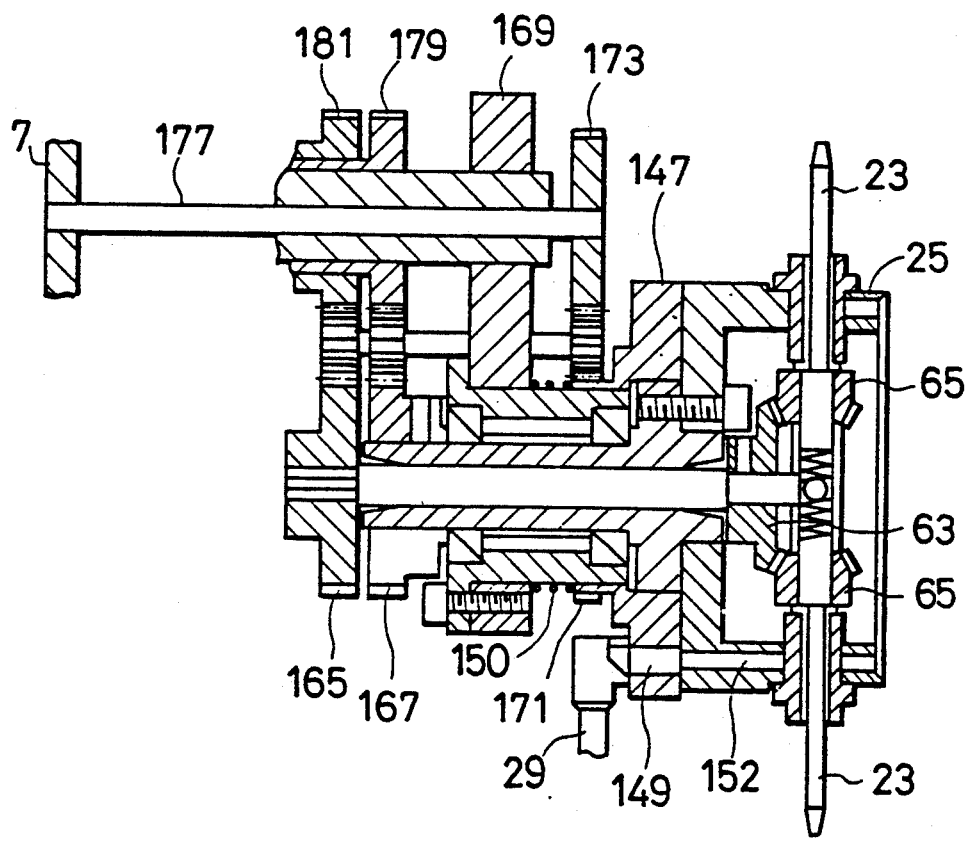
FIG. 12 is a cross sectional view of an alternative configuration for a pick-up motion driving section of the workpiece installation apparatus of FIG. 8.

Here, the planetary train formed by the pulleys 173, 179, 181, 165, 167, and 171 can be realized by using the gears instead of the belts, as shown in FIG. 12.

The pulley ratio of the rotatable head driving pulley 167, the suction nozzle driving pulley 165, and the pulley 171 of the circular member 147 with respect to the final pulleys 179, 181, and 173 is set equal to 1:1.

By means of this planetary train configuration, the rotatable head 25 maintains a constant orientation in which the selected one of the suction nozzles 23 is pointing downward while rotating around the fixed shaft 177.

The first transmission path 43 is a transmission system for providing the driving power from a sixth motor M6 attached to the rotatable drum 7 by a bracket and from the rotatable drum 7 simultaneously through the differential gear 185.

This differential gear 185 is generally known as a harmonic gear which is supported by the rotatable drum 7, and has two transmission systems including a motor transmission system for transmitting the driving power of the sixth motor M6 to the bevel gear 187, and the rotatable drum transmission system for transmitting the driving power from the rotatable drum 7 to the bevel gear 187 as the transmission gear 191 is rotated around the ring gear 189 while spinning around itself by the engagement of the ring gear 189 attached to the fixed sleeve 153 and the transmission gear 191.

The output bevel gear 187 is pierced through by the fixed shaft 177, and engaged with the bevel gear 198 provided on the sleeve shaft 193.

Thus, when the sixth motor M6 is off and the rotatable drum 7 rotates in the direction of the arrow E, the transmission gear 191 rotates while spinning around itself in a state of being engaged with the ring gear 189, the rotational driving power is transmitted from the transmission gear 191 to the sleeve shaft 193 through the bevel gears 187 and 198 as the rotational driving power into a counter-clockwise direction. As a result, the suction nozzles 23 of the rotatable head 25 repeat the pick-up motion of moving up and down along a trajectory of a cycloidal curve N shown in FIG. 3.

Here, by rotating the ring gear 189 into the same direction as the rotatable drum 7 by controlling the operation of the sixth motor M6 while the rotatable drum 7 is rotating, the period of the pick-up motion of the suction nozzles 23 can be made longer.

More specifically, in this embodiment, the suction nozzle 23 pointing downward is going to rotate in the counter-clockwise direction for approximately 5 times while moving from the supply table 9 to the XY table 11 by the 180 degrees rotation of the rotatable drum 7, so that the pick-up motion along the trajectory of the cycloidal curve in which the suction nozzle 23 is lowered twice during one cycle L as shown in FIG. 3 can be obtained by controlling the sixth motor M6 for 4 rotations. In this pick-up motion, the rotation rate is set equal to such a value that the speed of the top end of the suction nozzle 23 due to the rotation of the rotatable drum 7 in the direction of the arrow E and the speed of the top end of the suction nozzle 23 due to the rotation of the rotatable head 25 in the counter-clockwise direction are going to coincide with each other, so that the suction nozzle 23 has a net relative speed with respect to the ground equal to approximately zero at the lowered position. As a result, the stable suction operation can be achieved in this embodiment, and by controlling the operation of the sixth motor M6 differently such as for 3 rotations or 4.5 rotations, the one cycle L of the cycloidal curve N can be lengthen or shorten, so that the pick-up motion of the suction nozzle 23 can be carried out with respect to the entire region of the supply table 9.

Moreover, by controlling in such a manner as to give the rotational angles ten times larger than that of the rotatable drum 7 to the rotatable head 25, the rotatable head 25 can be put into the rotational motion without spinning around itself, so that the rotatable head 25 rotates while the suction nozzles 23 are lowered only when the workpieces are to be picked up and released. As a result, the possible interference of the suction nozzles 23 with the other elements can be avoided.

The second transmission path 69 is a transmission system for controlling the orientation of the workpiece P which provides the driving power from a seventh motor M7 attached to the rotatable drum 7 to the suction nozzle driving pulley 165 through the input pulley 195. The input pulley 195 is fixed to the sleeve shaft 196 of the final pulley 181, and is connected with the motor pulley 197 of the seventh motor M7 through the transmission belt.

The third transmission path 71 is a transmission system for selecting one of the suction nozzles 23 which provides the driving power from an eighth motor M8 attached to the rotatable drum 7 to the rotatable head driving pulley 167 through the input pulley 201. The input pulley 201 is fixed to the sleeve shaft 200 of the final pulley 179, and is connected with the motor pulley 203 of the eighth motor M8 through the transmission belt 205.

Thus, by the controlling of the eighth motor M8, apart from the selection of the suction nozzles 23 by the 90 degrees rotation of the rotatable head 25, the rotatable head 25 can be rotated for 45 degrees, for example, after the completion of the workpiece installation, so as to put the suction nozzles 23 in non-operative orientation different from the operative orientation of pointing downward. As a result, the possible interference of the suction nozzles 23 with the other elements can be avoided.

Moreover, the configuration of this embodiment is simpler than that of the first embodiment described above in that the entire link mechanism 27 and the first link shaft 45 in the first embodiment is replaced by the fourfold shaft configuration formed by the fixed shaft 177, sleeve shaft 193, sleeve shaft 200, and sleeve shaft 196.

In addition, as shown in FIG. 8, there is provided a control unit SL to which information is inputted from various sensors such as a workpiece monitoring sensor for checking a state in which the workpiece is held by the suction nozzles 23, and a rotation angle sensor for detecting an angle of rotation of the rotatable drum 7, and which outputs control signals to control the opening and closing of the valve 31 and the starting and stopping of the first to eighth motors M1 to M8 appropriately in accordance with the inputted information.

Now, the operation of this workpiece installation apparatus of the second embodiment will be described.

Figure 11:
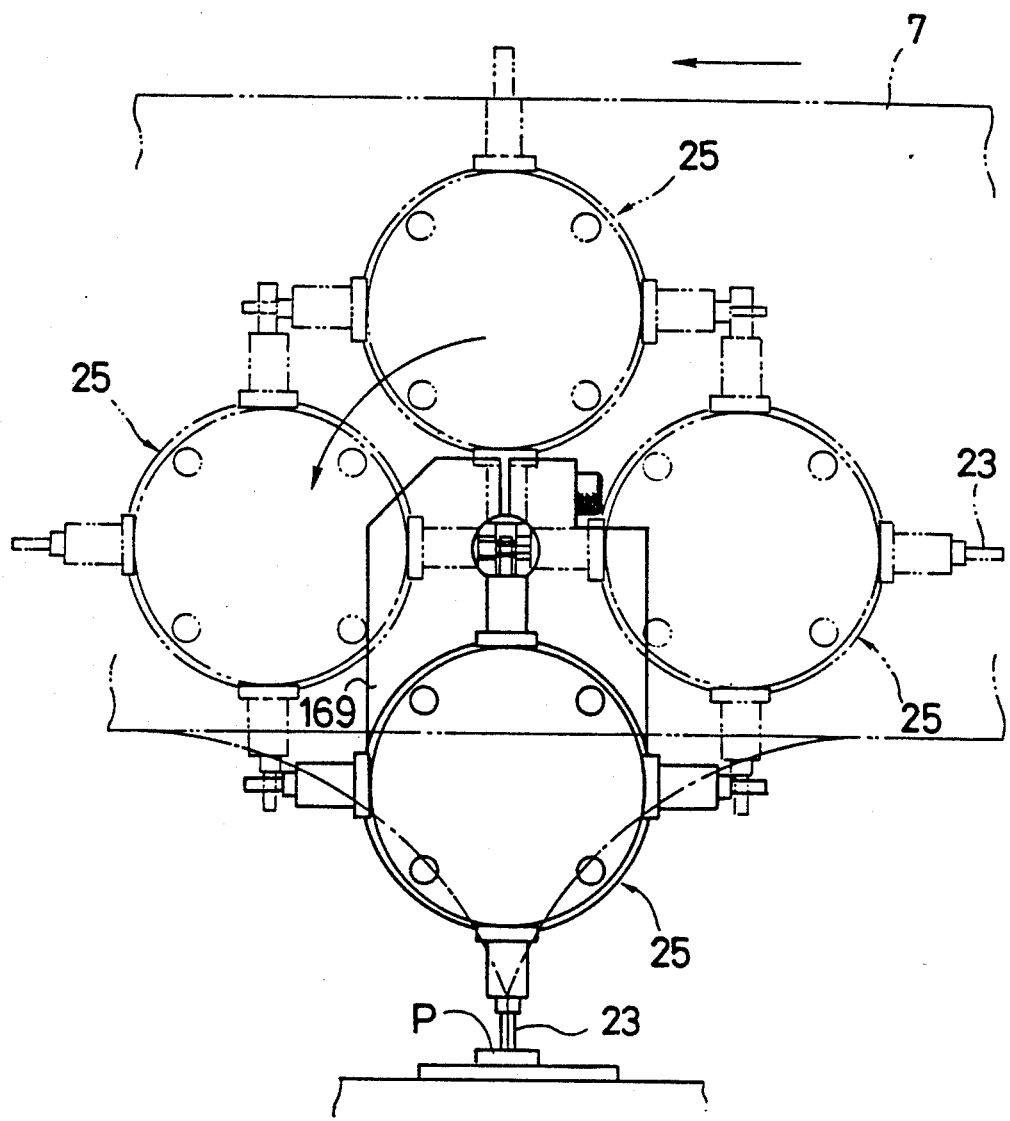
FIG. 11 is a detail illustration of a motion of the rotatable head of the workpiece installation apparatus of FIG. 8.

With respect to the rotatable drum 7 which is continuously rotating in the direction of the arrow E, the suction nozzle 23 pointing downward continues to rotate in the counter-clockwise direction as shown in FIG. 11. Here, the suction nozzles 23 repeat the pick-up motion along the cycloidal trajectory N shown in FIG. 3 of a relatively long period L according to the control by the control unit SL. In this pick-up motion, the relative speed of the suction nozzles 23 with respect to the ground becomes substantially equal to zero at the lowered position, so that the picking up of the workpiece P from the supply table 9 can be achieved stably. Then, the suction nozzles 23 holding the workpieces P is rotated around to the XY table 11 while repeating the pick-up motion along the cycloidal trajectory, and release the workpieces P on the printed circuit board 19 on the XY table 11 to install the workpieces P.

Here, by controlling the seventh motor M7 so as to transmit the driving power to the final pulley 181 through the second transmission path 69 in order to adjust the orientation angle of the suction nozzles 23, the accurate installation of the workpieces P on the printed circuit board 19 can be achieved.

Also, by controlling the eighth motor M8 so as to transmit the driving power to the final pulley 179 through the third transmission path 71 in order to rotate the rotatable head 25 by 90 degrees, the selection of the appropriate one of the suction nozzles 23 in accordance with the size of the workpiece P can be achieved.

In this embodiment, the rotatable drum 7 maintains the continuous rotation throughout the operation of the apparatus, so that there is a no time loss due to the stopping of the rotatable drum 7.

Moreover, by controlling the period L of the cycloidal trajectory N of the pick-up motion of the suction nozzles 23, the workpieces P can be picked up over the entire region of the supply table 9, and then the workpieces P can be installed on the printed circuit board 19 on the XY table 11 without stopping the rotation of the rotatable table 7, so that the efficiency in the process of workpiece installation can be improved.

Figure 13:
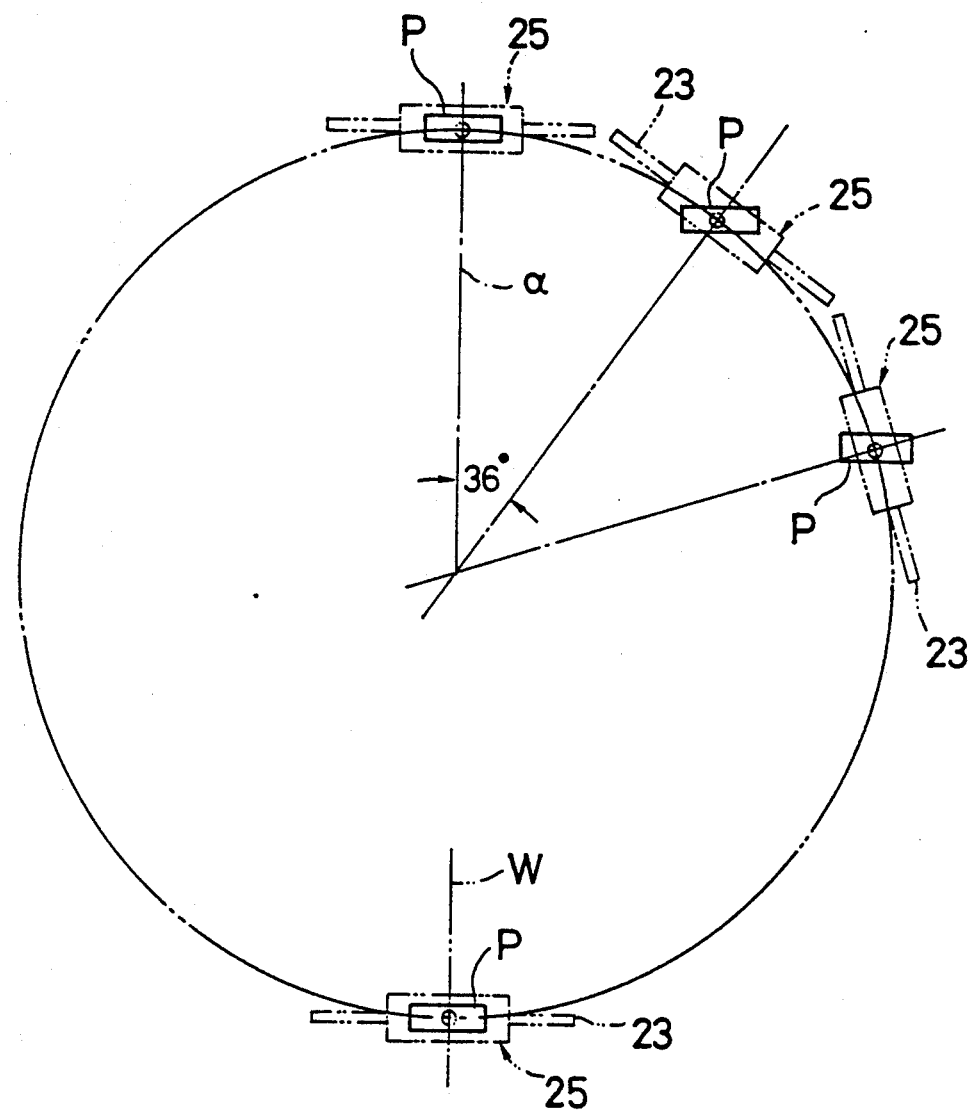
FIG. 13 is an illustration of the motion of a rotatable head portion of the third embodiment of a workpiece installation apparatus according to the present invention.

Referring now to FIG. 13, the third embodiment of the workpiece installation apparatus according to the present invention will be described.

In this third embodiment, the above described second embodiment is modified in that the pulley ratio of the rotatable head driving pulley 167 and the pulley 171 of the circular member 147 with respect to the final pulleys 173 and 179 is set equal to 1:1, while the pulley ratio of the suction nozzle driving pulley 165 and the final pulley 181 is set equal to 11:10. This latter rate of 11:10 is selected for the following reason. In this embodiment, the apparatus is constructed such that the rotatable head 25 rotates once around while it spins around itself for ten times, so that as shown in FIG. 13, the workpiece P can be carried from the supply table 9 to the XY table 11 in the exactly the same orientation as it is picked up at the supply table 9 by making the rotatable head 25 to rotate by 36 degrees during it spins around itself once, and the accurate installation of the workpiece P with respect to the line W can be secured.

Thus, in this embodiment, the selected one of the suction nozzle 23 can be maintained to be constantly pointing downward throughout the rotation of the rotatable head 25 around the fixed shaft 177, in conjunction with the planetary gear train of the apparatus described above.

Here, by controlling the seventh motor M7 so as to transmit the driving power to the final pulley 181 through the second transmission path 69, the suction nozzles 23 spins around itself during its rotation such that the workpiece P is maintained in the same orientation, so that the accurate installation of the workpieces P on the printed circuit board 19 can be achieved.

Figure 14:
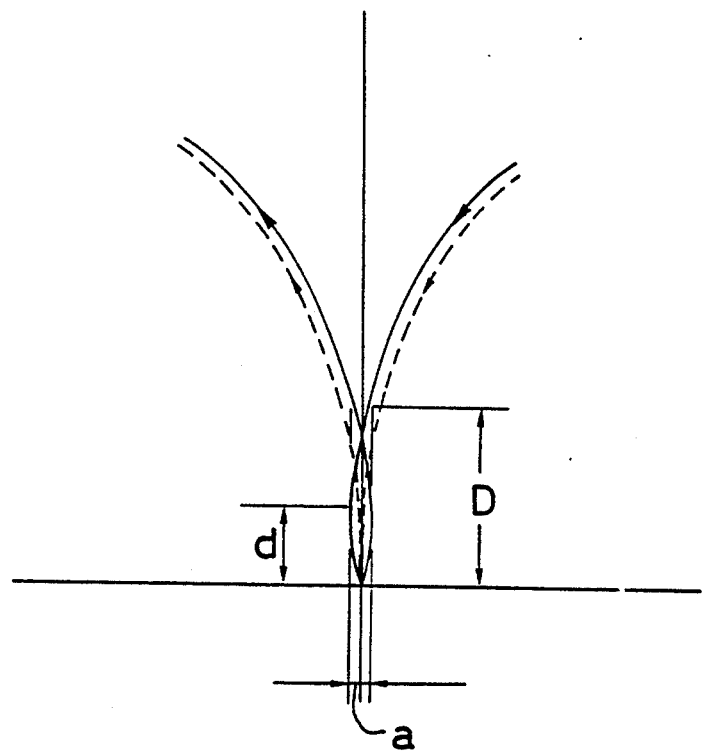
FIG. 14 is an illustration of a part of a trajectory of a rotatable head portion of the fourth embodiment of a workpiece installation apparatus according to the present invention.

Referring now to FIG. 14, the fourth embodiment of the workpiece installation apparatus according to the present invention will be described.

In this fourth embodiment, the above described second embodiment is modified such that the apparatus is constructed such that the rotatable head 25 rotates once around while it spins around itself for ten times, while the first transmission path 43 is constructed as a transmission system for a quasi-cycloidal motion which provides the driving power from a sixth motor M6 attached to the rotatable drum 7 by a bracket and from the rotatable drum 7 simultaneously through the differential gear 185.

Namely, in contrast to the above described second embodiment in which the ratio of the head rotation radius r from the fixed shaft 177 to the first shaft 159 with respect to the drum rotation radius R from the rotatable drum shaft 5 to the suction nozzles 23 is set equal to the standard cycloid ratio of 1:10, the head rotation radius r is slightly extended such that the ratio of the head rotation radius from the fixed shaft 177 to the first shaft 159 with respect to the drum rotation radius R from the rotatable drum shaft 5 to the suction nozzles 23 is set equal to the quasi-cycloid ratio such as 1.01:10 for example. Alternatively, the drum rotation radius R can be slightly shortened in order to obtain the quasi-cycloid ratio of 1:9.9 for example. Moreover, the quasi-cycloidal trajectory can also be obtained by appropriately adjusting the rotational angular velocity of the rotatable head 25 and the rotational angular velocity of the rotatable drum 7.

With this configuration, the cycloidal trajectory of the top end of the suction nozzle 23 near the lowered position deviates from that in the second embodiment which is shown in FIG. 14 by a dashed line to that shown in FIG. 14 by a solid line in which vertical stroke D can be made larger than the vertical stroke d in the second embodiment. Here, the trajectory of the suction nozzle 23 is determined within the limit of the tolerable pick-up position error range a in the drum circumference direction.

Thus, as the driving power is transmitted to the suction nozzle driving gear 61 to rotate the suction nozzles 23 through the side gear 63 and the pinion gear 65, the orientation angle of the suction nozzles 23 is adjusted such that the accurate installation of the workpieces P with respect to the line W can be achieved.

In this embodiment, the suction nozzles 23 moves along the quasi-cycloidal trajectory which has a longer vertical stroke D, so that the failure of picking up the workpiece P at the supply table 9 by the suction nozzles 23 can be prevented. Moreover, the installation of the workpiece P at the XY table 11 can also be carried out accurately.

Thus, according to this embodiment, the improvement of the efficiency in the process of workpiece installation can be improved by realizing the continuous rotation of the rotatable drum 7, while at the same time the accuracy in the process of workpiece installation can also be improved by realizing the quasi-cycloidal trajectory for the suction nozzles 23.

Referring now to FIG. 15 to FIG. 22, the fifth embodiment of the workpiece installation apparatus according to the present invention will be described.

Figure 15:
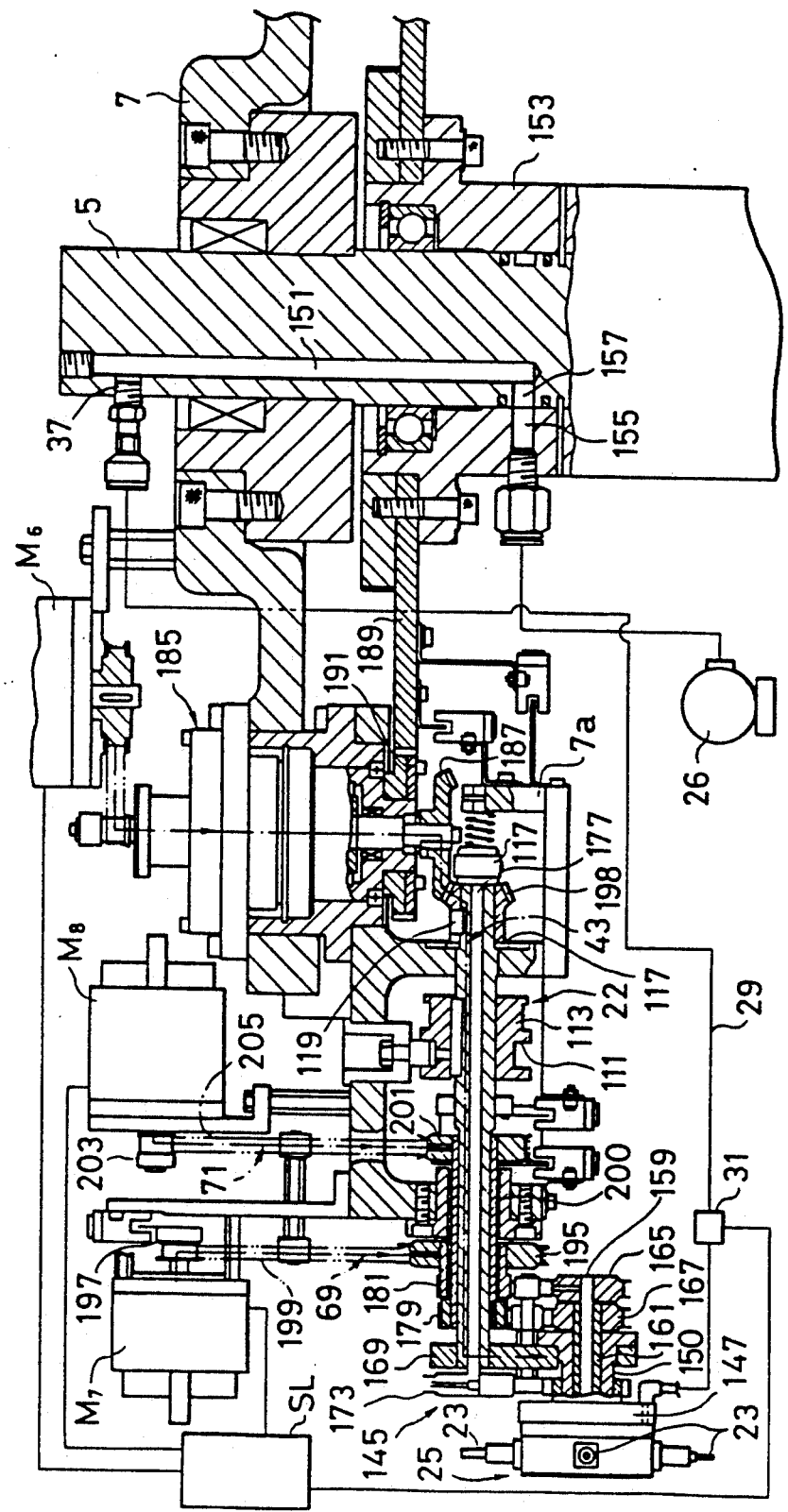
FIG. 15 is a schematic cross sectional view of a main portion of the fifth embodiment of a workpiece installation apparatus according to the present invention.
Figure 16:
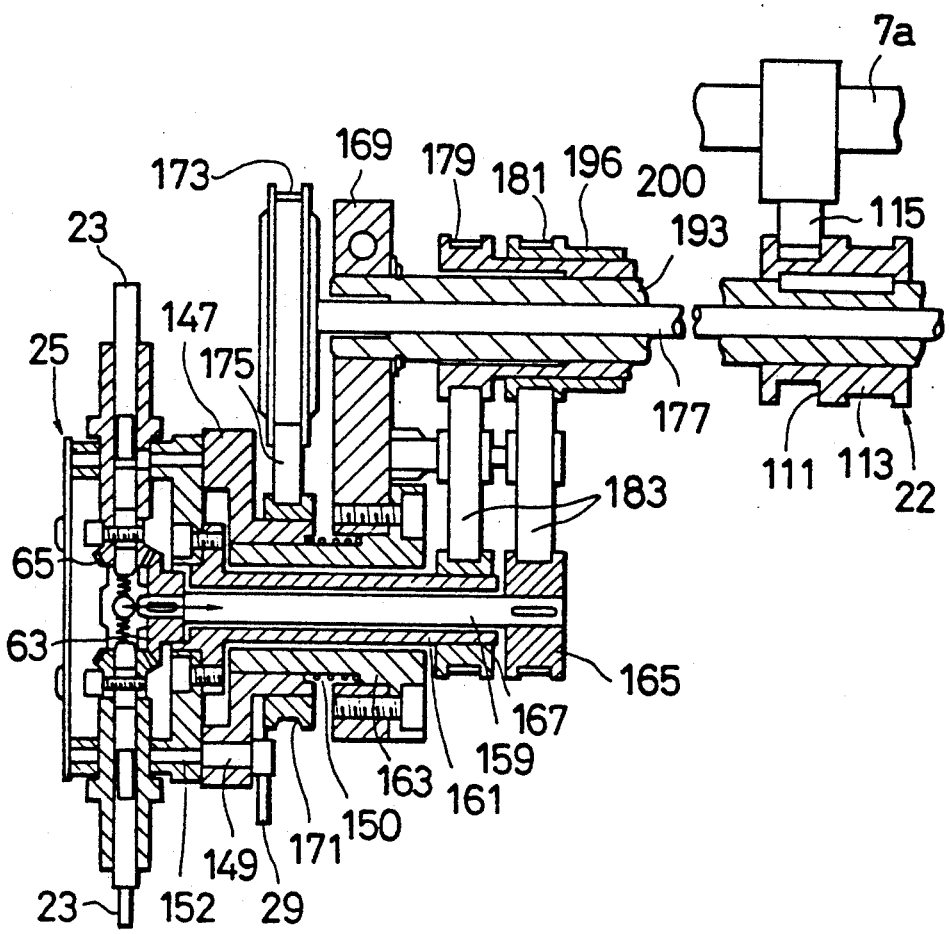
FIG. 16 is a detail cross sectional view of a rotatable head portion of the workpiece installation apparatus of FIG. 15.

In this fifth embodiment, the above described second embodiment is modified as shown in FIG. 15 and FIG. 16 such that the rotatable head 25 is further equipped with a rotatable head sliding unit 22 for sliding the rotatable head 25 along the direction of the diameter of the rotatable drum 7.

This rotatable head sliding unit 22 comprises a cam member 113 attached to the sleeve shaft 193 which has a cam groove 111 to be engaged with the cam protrusion 115 fixed to the supporting flame 7a. Thus, by rotating the cam member 113, the sleeve 193 and therefore the rotatable head 25 can be slid along the direction of the diameter of the rotatable drum 7 indicated by the arrow in FIG. 16. The cam groove 111 of the cam member 113 is such that the top end of the suction nozzle 23 does not project out of the rotational trajectory $\beta$ of the rotatable drum 7.

Figure 17:
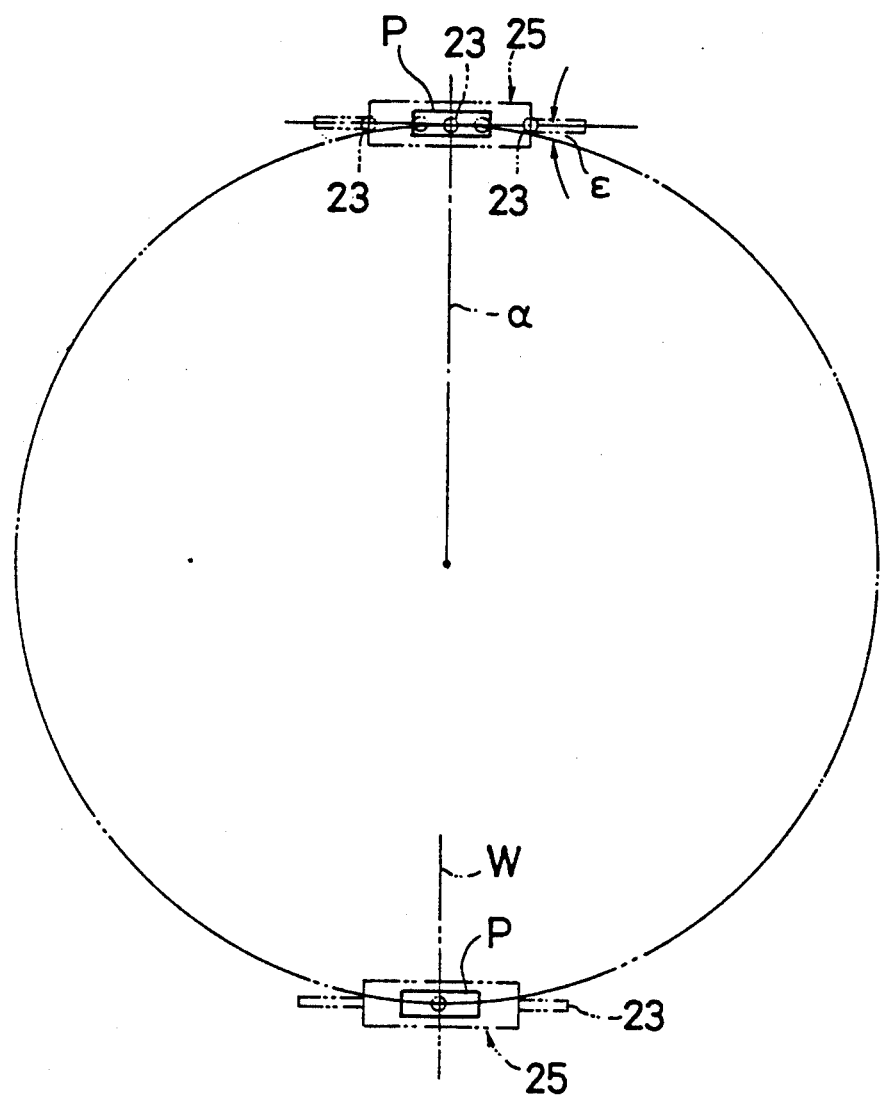
FIG. 17 is an illustration of the motion of a rotatable head portion of the workpiece installation apparatus of FIG. 15.
Figure 18:
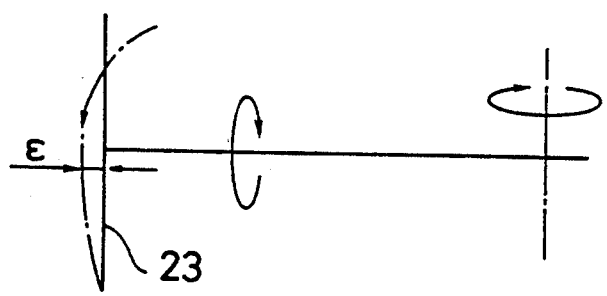
FIG. 18 is an illustration of a part of a trajectory of a suction nozzle portion of the workpiece installation apparatus of FIG. 15.
Figure 19:
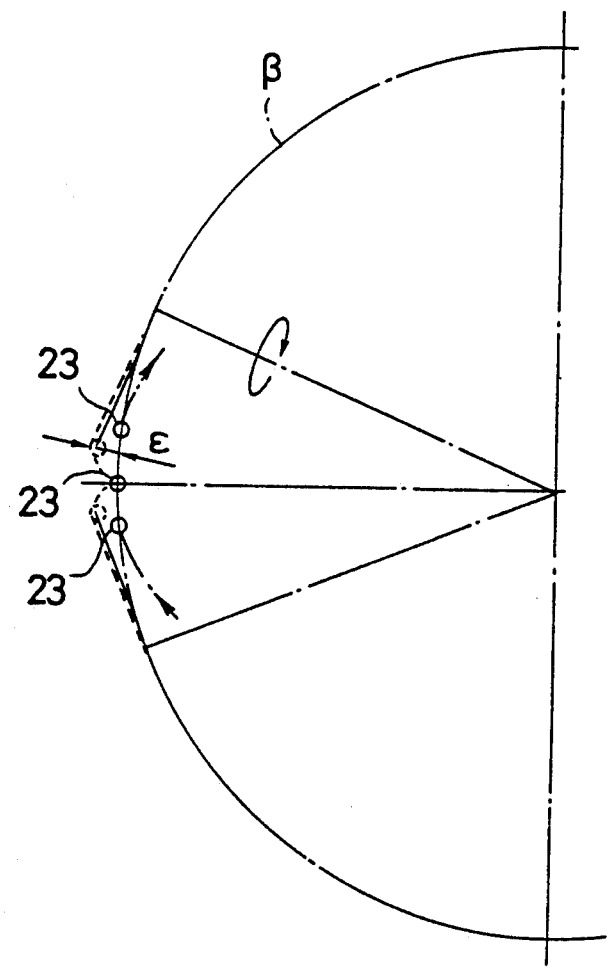
FIG. 19 is an illustration of a part of the motion of a suction nozzle portion of the workpiece installation apparatus of FIG. 15.

Namely, in the second embodiment described above, the suction nozzle 23 rotates in an orientation of pointing downward, so that in a process of rotating the rotatable head 25 around an axis $\alpha$, the suction nozzles 23 inevitably project out from the rotational trajectory $\beta$ of the rotational drum 7 by a length $\epsilon$ as shown in FIG. 17 and FIG. 18, and therefore the trajectory of the suction nozzles 23 appears irregular in vicinities of the pick-up and release positions as indicated by the dashed line in FIG. 19. In contrast, in this fifth embodiment, this irregularity of the trajectory for the suction nozzles 23 is absorbed by the sliding motion of the rotatable head 25 caused by the rotatable head sliding unit 22 such that the suction nozzles 23 moves along the trajectory indicted by the one dot chain line in FIG. 19 which is regular in vicinities of the pick-up and release positions.

Also, the bevel gear 198 attached to the sleeve shaft 193 has its motion in the direction of the diameter of the rotatable drum 7 prohibited by the stopper members 117 while supported slidably by the key 119, such that the engagement between the differential gear 185 and the bevel gear 187 is ensured.

Thus, in this embodiment, the suction nozzles 23 slide in the direction of the diameter of the rotatable drum 7 in vicinities of the pick-up and release positions, so that the regular movement of the suction nozzles 23 along the rotational trajectory $\beta$ of the rotatable drum 7 can be secured, and the accurate holding of the workpiece P at the supply table 9 and the accurate installation of the workpiece P to the designated position on the XY table 11 becomes possible.

Figure 20:
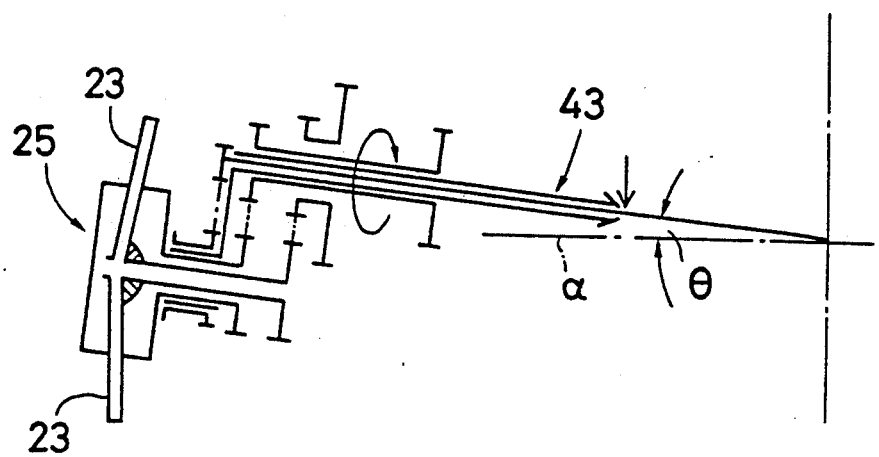
FIG. 20 is an illustration of a part of a rotatable head portion of the workpiece installation apparatus of FIG. 15.
Figure 21:
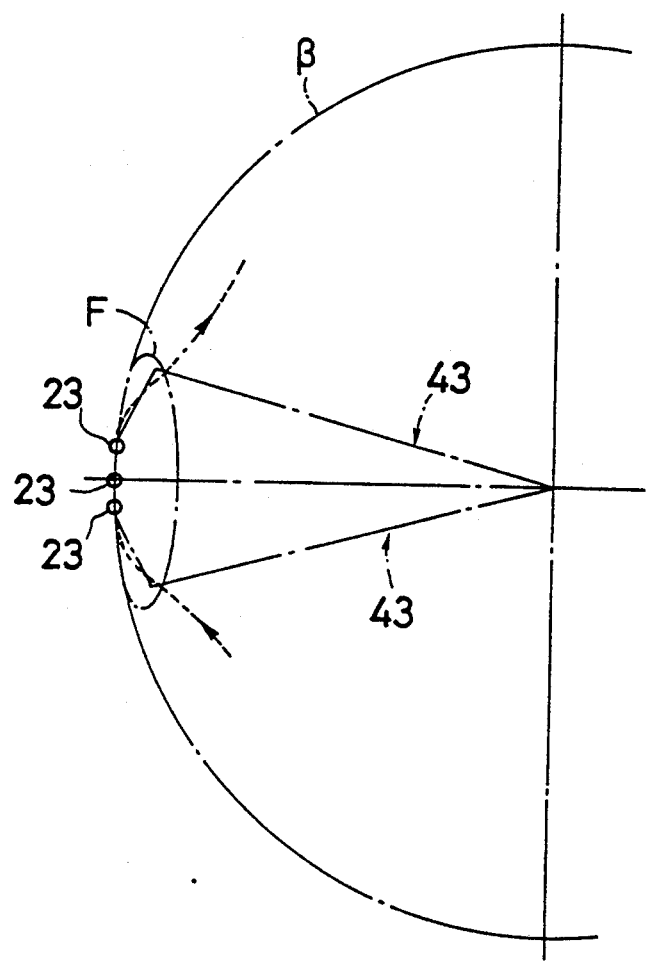
FIG. 21 is an illustration of a part of the motion of a suction nozzle portion on the rotatable head portion of FIG. 20 in the workpiece installation apparatus of FIG. 15

In addition, as shown in FIG. 20, the rotatable head 25 can be inclined upward by an angle $\theta$ with respect to the axis $\alpha$ such that the top end of the suction nozzle 23 moves along the trajectory which passes within the rotational trajectory $\beta$ of the rotatable drum 7 and overlaps with the rotational trajectory $\beta$ in vicinities of the pick-up and release positions as indicated by the dashed line in FIG. 21.

Namely, the fixed shaft 177 is inclined upward by the angle $\theta$ and the selected one of the suction nozzles 23 is oriented perpendicularly, such that the top ends of the suction nozzles 23 moves along an ellipse F at the pick-up and release positions as shown in FIG. 21.

With respect to the rotatable drum 7 which is continuously rotating in the direction of the arrow E, the suction nozzle 23 pointing downward continues to rotate in the counter-clockwise direction. Here, the suction nozzles 23 repeat the pick-up motion along the cycloidal trajectory of a relatively long period L according to the control by the control unit SL. In this pick-up motion, the relative speed of the suction nozzles 23 with respect to the ground becomes substantially equal to zero at the lowered position, so that the picking up of the workpiece P from the supply table 9 can be achieved stably. Then, the suction nozzles 23 holding the workpieces P is rotated around to the XY table 11 while repeating the pick-up motion along the cycloidal trajectory, and release the workpieces P on the printed circuit board 19 on the XY table 11 to install the workpieces P.

Figure 22:
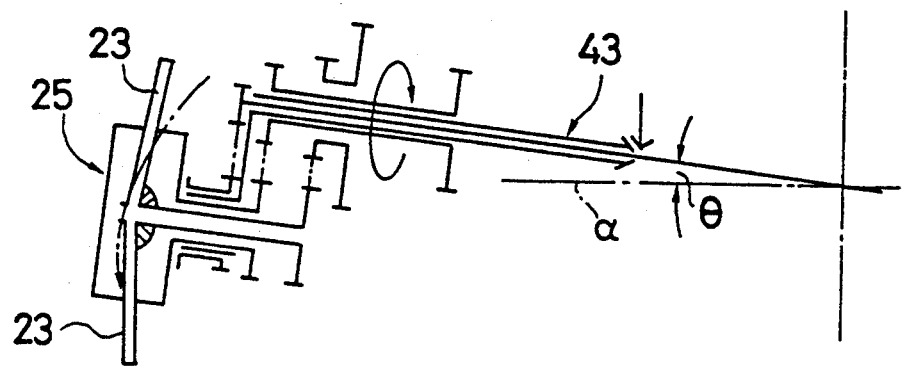
FIG. 22 is an illustration of a part of a rotatable head portion of the workpiece installation apparatus of FIG. 15 with a part of a trajectory of a suction nozzle portion indicated.

Thus, in this embodiment, the regular movement of the suction nozzles 23 along the rotational trajectory β of the rotatable drum 7 can be secured as shown in FIG. 22, and the accurate holding of the workpiece P at the supply table 9 and the accurate installation of the workpiece P to the designated position on the XY table 11 becomes possible.

Referring now to FIG. 23 to FIG. 28, the sixth embodiment of the workpiece installation apparatus according to the present invention will be described.

In this sixth embodiment, the above described second embodiment is modified in that the pulley 173 is fixed to the fixed shaft 177 and the planetary gear train is formed such that the rotatable head 25 rotates while spinning around itself as the link 169 is rotated by the first transmission path 43 with the final pulleys 179 and 181 stopped.

Moreover, an in the third embodiment described above, the above described second embodiment is further modified in that the pulley ratio of the rotatable head driving pulley 167 and the pulley 171 of the circular member 147 with respect to the final pulleys 173 and 179 is set equal to 1:1, while the pulley ratio of the suction nozzle driving pulley 165 and the final pulley 181 is set equal to 11:10, where this latter rate of 11:10 is selected for the reason that the apparatus is constructed such that the rotatable head 25 rotates once around while it spins around itself for ten times, so that the workpiece P can be carried from the supply table 9 to the XY table 11 in the exactly the same orientation as it is picked up at the supply table 9 by making the rotatable head 25 to rotate by 36 degrees during it spins around itself once, and the accurate installation of the workpiece P with respect to the line W can be secured.

Thus, in this embodiment, the selected one of the suction nozzle 23 can be maintained to be constantly pointing downward throughout the rotation of the rotatable head 25 around the fixed shaft 177, in conjunction with the planetary gear train of the apparatus described above.

Here, the sixth motor M6 is controlled such that the rotatable head 25 rotates once around while it spins around itself for ten times, so that the workpiece P can be carried from the supply table 9 to the XY table 11 in the exactly the same orientation as it is picked up at the supply table 9 by making the rotatable head 25 to rotate by 36 degrees during it spins around itself once. By controlling the speed of the sixth motor M6, the speed of the pick-up motion can also be controlled such that the pick-up motion can be carried out over the entire range of the supply table 9.

Also, by controlling the seventh motor M7 so as to transmit the driving power to the final pulley 181 through the second transmission path 69, the suction nozzles 23 spins around itself during its rotation such that the workpiece P is maintained in the same orientation, so that the accurate installation of the workpieces P on the printed circuit board 19 can be achieved.

Also, the control unit SL in this embodiment is such that in addition to the function of collecting the information from various sensors such as a workpiece monitoring sensor for checking a state in which the workpiece is held by the suction nozzles 23, and a rotation angle sensor for detecting an angle of rotation of the rotatable drum 7, and outputting the control signals to control the opening and closing of the valve 31 and the starting and stopping of the first to eighth motors M1 to M8 appropriately in accordance with the inputted information, it possesses a motor control unit for controlling the operation of the sixth motor M6 with respect to the operation of the fifth motor M5 so as to control the movement of the suction nozzles 23 as described above.

This motor control unit of the control unit SL will now be described in detail. This motor control unit controls the sixth motor M6 for driving the bevel gear 187 which controls the first transmission path 43 with respect to the fifth motor M5 for driving the rotatable drum 7 such that the suction nozzles 23 perform the appropriate pick-up motion along the cycloidal trajectory N in which the workpiece P is picked up at the supply table 9, carried over to the XY table 11, and releasen at the XY table 11 to install the workpieces P.

Figure 23:
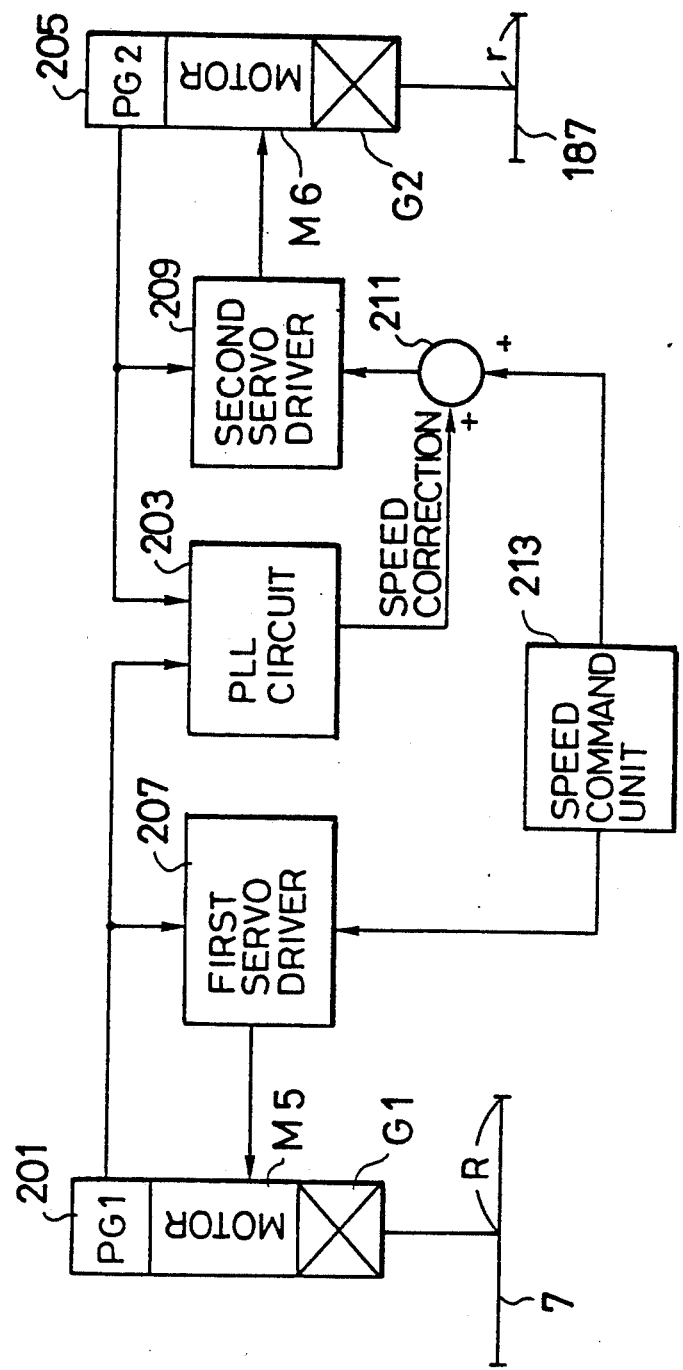
FIG. 23 is a schematic block diagram of a motor rotation control unit of the sixth embodiment of a workpiece installation apparatus according to the present invention.
Figure 24:
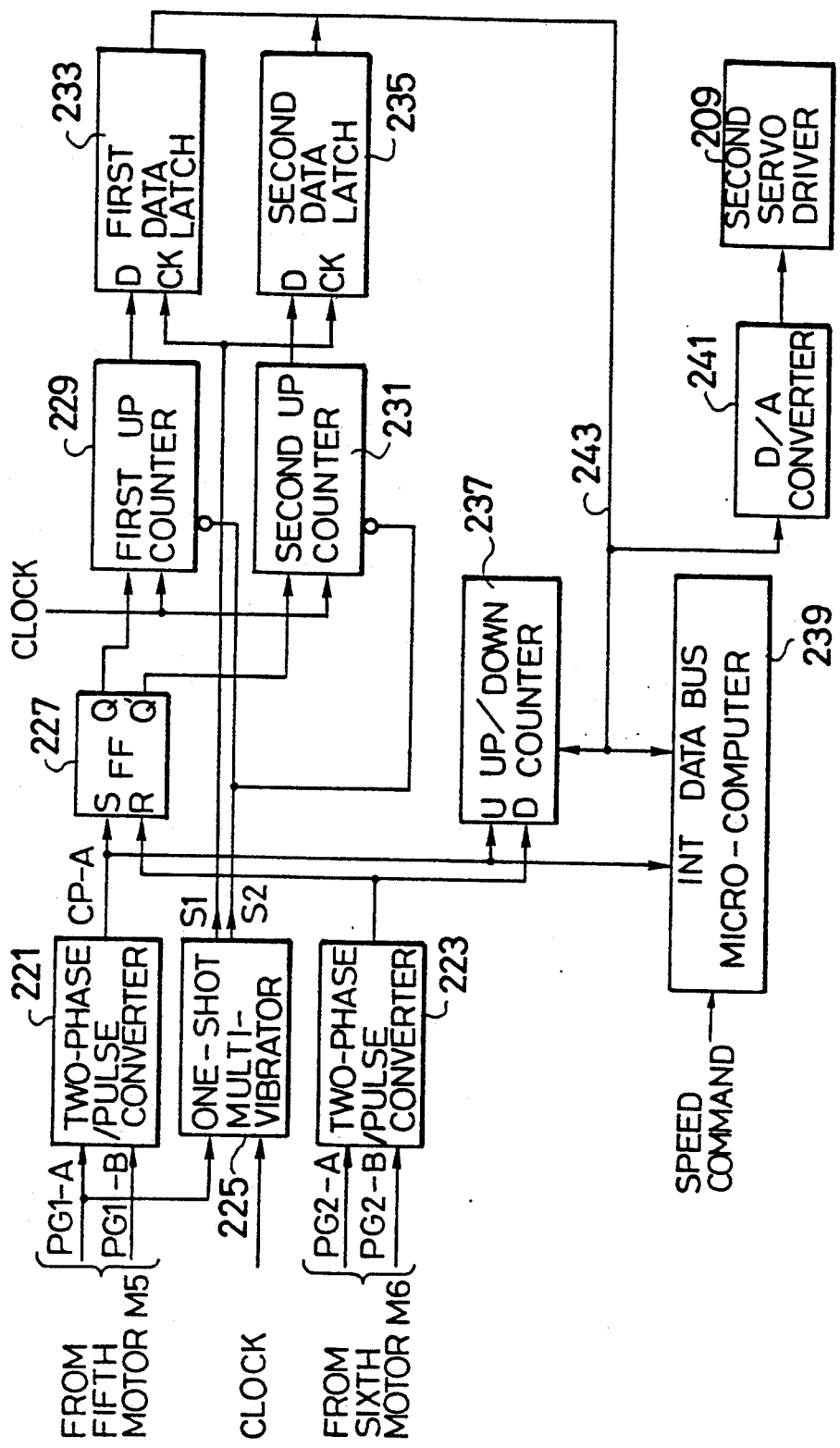
FIG. 24 is a detail block diagram of a main portion of the motor rotation control unit of FIG. 23.
Figure 25:
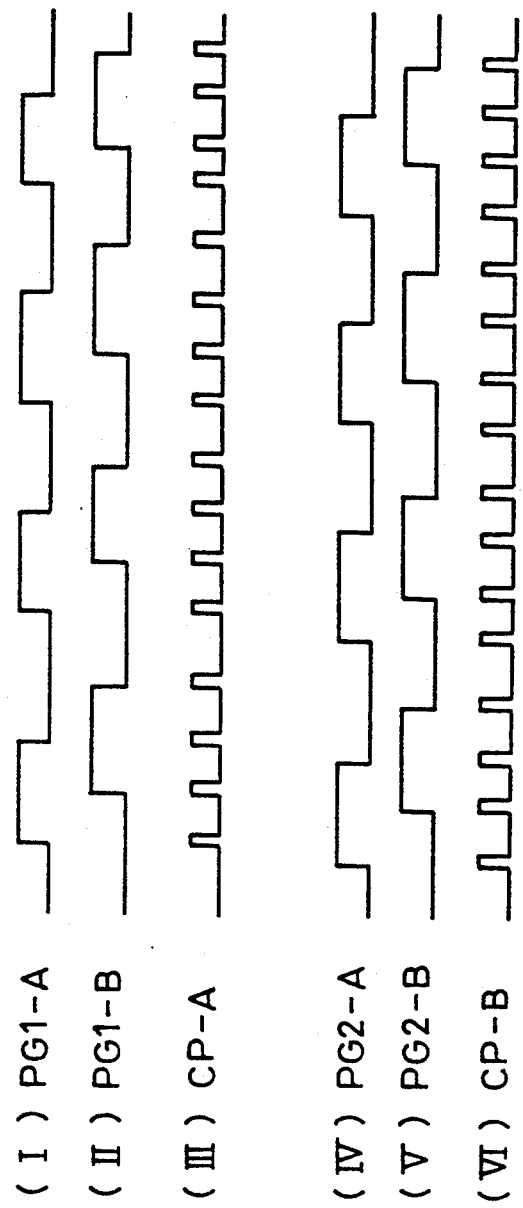
FIG. 25 is a timing chart for one set of signals in the motor rotation control unit of FIG. 23.
Figure 26:
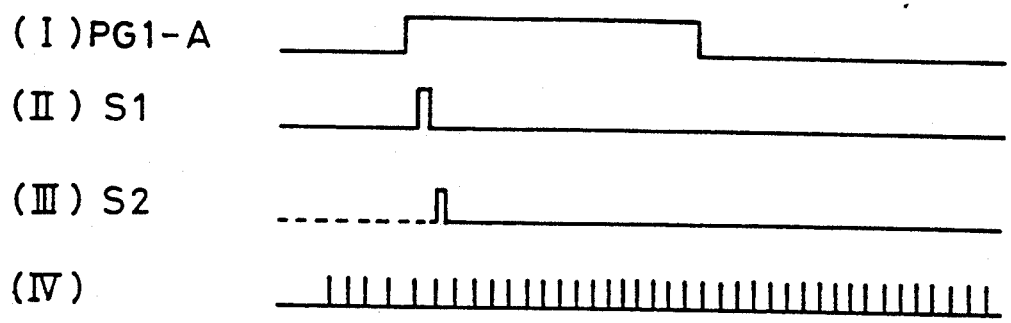
FIG. 26 is another timing chart for another set of signals in the motor rotation control unit of FIG. 23.

As shown in FIG. 23, this motor control unit has a configuration in which the rotation signal of the fifth motor M5 for rotating the rotatable drum 7 under the driving by the first servo driver 207 is supplied to the PLL (phase lock loop) circuit 203 through the first pulse generator 201, while the rotation signal of the sixth motor M6 for rotating the bevel gear 187 under the driving by the second servo driver 209 is supplied to the PLL circuit 203 through the second pulse generator 205, and the PLL circuit 203 obtains the difference between the phases of the rotation by the fifth motor M5 and the rotation by the sixth motor M6 as the speed correction signal to be added with the speed command signal for the sixth motor M6 generated from the speed command unit 213 at the adder 211 in order to control the second servo driver 209 in such a manner as to lock the phase of the second pulse generator 205 with respect to the first pulse generator 201, so as to realize the appropriate cycloidal motion of the suction nozzles 23 as described above.

Here, the output rate of the first and second pulse generators 201 and 205 is adjusted to be equal, such that the phases can be compared accurately.

Also, in order for the PLL circuit 203 to realize the cycloidal motion while keeping the phases of the fifth motor M5 and the sixth motor M6 synchronized, the ratio of the drum rotation radius R with respect to the head rotation radius r have to be inversely proportional to the ratio of the decelerations G1 and G2 of the fifth motor M5 and the sixth motor M6 as follows.

$$\frac{R}{r} = \frac{1/G1}{1/G2}$$

For instance, R=1000 mm and r=100 mm is possible when G1=1/100 and G2=1/10.

The PLL circuit 203 and the adder 211 can be formed integrally as follows. Namely, as shown in detail in FIG. 24, the circuit includes: a first two-phase/pulse converter 221 for converting the two-phase pulse signals PG1-A and PG1-B shown by (I) and (II) in FIG. 25 from the first pulse generator 201 into the pulse signal CP-A shown by (III) in FIG. 25 which indicate the edges of the two-phase pulse signals PG1-A and PG1-B; a second two-phase/pulse converter 223 for converting the two-phase pulse signals PG2-A and PG2-B shown by (IV) and (V) in FIG. 25 from the second pulse generator 205 into the pulse signal CP-B shown by (VI) in FIG. 25 which indicate the edges of the two-phase pulse signals PG2-A and PG2-B; and the one-shot multi-vibrator 225 for receiving one of the two-phase pulse signal PG1-A shown by (I) in FIG. 26 from the first pulse generator 201 and the clock pulse shown by (IV) in FIG. 26, and generating the data latch pulse signal S1 and the counter clear pulse signal S2 shown by (II) and (III) in FIG. 26 immediately after the rise of the two-phase pulse signal PG1-A.

The output pulse signal CP-A of the first two-phase/pulse converter 221 is supplied to the set input terminal S of the flip-flop 227, while the the output pulse signal CP-B of the second two-phase/pulse converter 221 is supplied to the reset input terminal R of the flip-flop 227. The output signal from the output terminal Q of the flip-flop 227 is supplied to the gate terminal G of the first up counter 229 which counts the clock pulses of 10 MHz frequency for example while the output signal of the flip-flop 227 is given to the gate terminal G. The inverted output signal from the inverted output terminal Q' of the flip-flop 227 is supplied to the gate terminal G of the second up counter 231 which counts the clock pulses while the inverted output signal of the flip-flop 227 is given to the gate terminal G. The flip-flop 227 is set by the pulse signal CP-A and reset by the pulse signal CP-B, so that the first up counter 229 counts the clock pulses for a period a between the pulse signals CP-A and CP-B as shown in FIG. 27, while the second up counter 229 counts the clock pulses for a period b between the pulse signals CP-B and CP-A as shown in FIG. 27.

Then, after the first and second up counters 229 and 231 counted the clock pulses during the periods a and b, by the next rise of the two-phase pulse signal PG1-A, the data latch pulse S1 is supplied from the one-shot multi-vibrator 225 to the clock terminals CK of the first data latch 233 and the second data latch 235, the clock pulses counted by the first and second up counters 229 and 231 are latched by the first and second data latches 233 and 235. Meanwhile, the first and second up counters 229 and 231 are cleared by the counter clear pulse signal S2 immediately following the data latch pulse signal S1 and counts the clock pulses again during the next periods a and b.

The output pulse signals CP-A and CP-B are also supplied to the up count terminal U and the down count terminal D of the up/down counter 237, so that the up/down counter 237 counts up the pulse signal CP-A and counts down the pulse signal CP-B.

Figure 27:
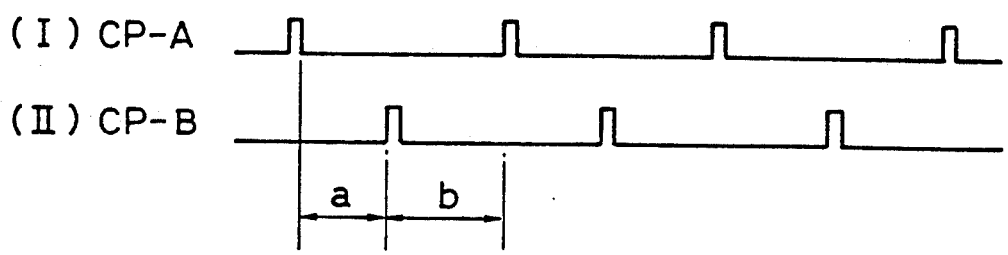
FIG. 27 is still another timing chart for still another set of signals in the motor rotation control unit of FIG. 23.

Normally, the pulse signals CP-A and CP-B are generated alternatively at the same rate as shown in FIG. 27 so that the count of the up/down counter 237 is indicating 0. However, when the rotation of the transmission gear 191 deviates by more than one period with respect to the rotation of the rotatable drum 7, the count of the up/down counter 237 indicates values other than 0 such as ±1, ±2, etc. so that such a deviation can be detected by the count of the up/down counter 237.

Figure 28:
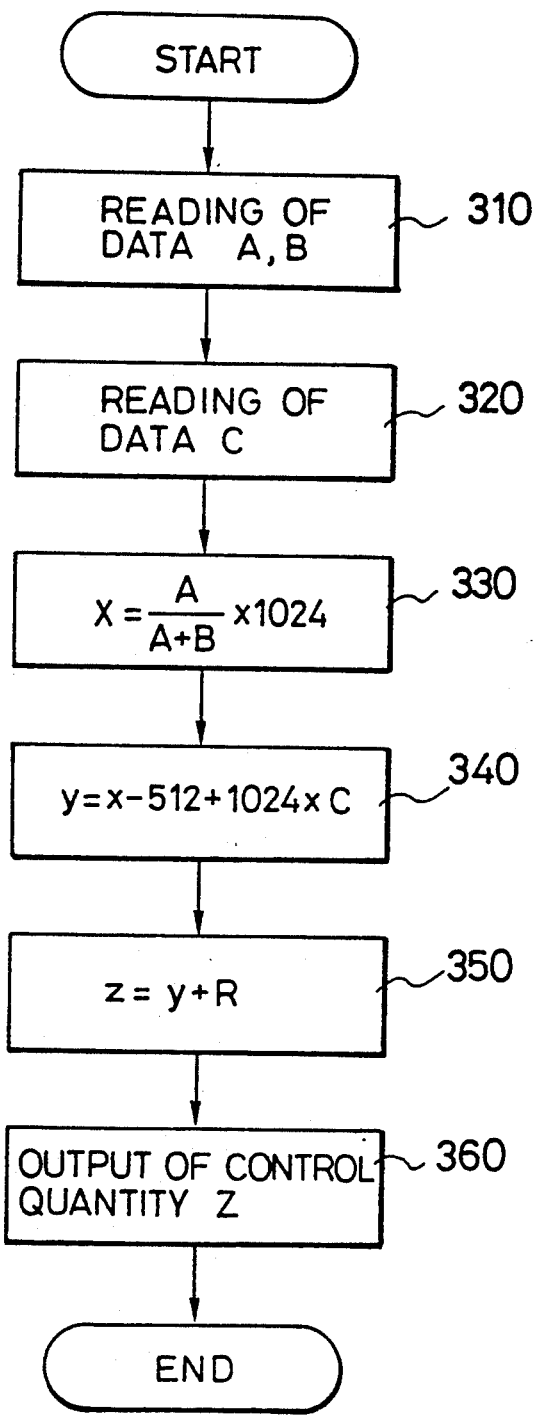
FIG. 28 is a flow chart for the control operation performed by a micro-computer in the motor rotation control unit of FIG. 23.

The counts latched by the first and second data latches 233 and 235 as well as the deviation detected by the up/down counter 237 are periodically given to the micro-computer 239 at the timing of the pulse signal CP-A, so that the micro-computer 239 can calculate the difference of the phases of the rotations of the rotatable drum 7 and the bevel gear 187 as the speed correction signal to be added with the speed command signal for the sixth motor M6 in order to obtain the control quantity by which the second servo driver 209 to drive the sixth motor M6 is to be controlled, according to the flow chart of FIG. 28 to be described in detail below. The control quantity obtained by the micro-computer 239 is supplied to the second servo driver 209 through the D/A converter 241, according to which the second servo driver 209 controls the sixth motor M6 in such a manner as to lock the phase of the second pulse generator 205 with respect to the first pulse generator 201, so as to realize the appropriate cycloidal motion of the suction nozzles 23 as described above.

The operation of the micro-computer 239 proceeds according to the flow chart of FIG. 28 as follows.

The operation of the micro-computer 239 is initiated by the pulse signal CP-A. First, at the step 310, the micro-computer 239 reads the counts for the periods a and b latched by the first and second data latches 233 and 235 as data A and B. Then at the step 320, the micro-computer 239 reads the data from the up/down counter 237 as data C. Next at the step 330, the micro-computer 239 calculates a value $x = 1024 \times A/(A+B)$ which is a ratio normalized with respect to the conversion range of 1024 ($-512$ to $+512$) for the D/A converter 241. When the phases of the rotations of the fifth and the sixth motors M5 and M6 are synchronized so that the data A and B are equal, this value x is equal to 512.

Then at the step 340, the micro-computer 239 calculates a phase correction quantity y according to the formula $y = x - 512 + 1024 \times C$.

Then at the step 350, the micro-computer 239 calculates the control quantity z as a sum of the phase correction quantity y and the speed command value for the bevel gear 187, which is then outputted at the step 360 to the second servo driver 209 through the D/A converter 241.

Thus, this motor control unit can controls the operation of the sixth motor M6 with respect to the operation of the fifth motor M5 according to the phase difference of the rotations of the rotatable drum 7 and the bevel gear 187 such that the movement of the suction nozzles 23 can be controlled along the desired cycloidal trajectory as described above.

It is to be noted that the suction nozzles 23 in the above embodiments may be replaced by the other holding means such as those using the electromagnets.

It is also to be noted that the workpiece installation apparatus of the present invention is applicable to the workpiece installation process other than that for the electronic component chips and the printed circuit board described above as an example.

Besides these, many modifications and variations of the above embodiments may be made without departing from the novel and advantageous features of the present invention. Accordingly, all such modifications and variations are intended to be included within the scope of the appended claims.

What is claimed is:

1. A workpiece installation apparatus, comprising:
   rotatable drum means for continuously rotating in a horizontal plane around a fixed axis;
   workpiece carrier means, mounted to a circumference of the rotatable drum means, for carrying a workpiece from a workpiece supply station to a workpiece installation station, and capable of spinning in a plane at least substantially perpendicular to the horizontal plane on the circumference while carrying the workpiece in a vertical trajectory; and
   control means for controlling the workpiece carrier means such that the workpiece carrier means spins while the rotatable drum means rotates so as to move along a prescribed trajectory, and such that the workpiece is picked up by the workpiece carrier means at a prescribed pick-up position on the workpiece supply station and released at a prescribed installation position on the workpiece installation station, wherein the pick-up position and the installation position are located at vertical levels near lowest positions in the prescribed trajectory.

2. The workpiece installation apparatus of claim 1, further comprising means for sliding the workpiece carrier means along a diameter of the rotatable drum means such that the workpiece carrier means moves within a rotational trajectory of the rotatable drum means.

3. The workpiece installation apparatus of claim 1, wherein the workpiece carrier means is mounted on the circumference such that a spinning axis of the workpiece carrier means is inclined by a prescribed angle with respect to the horizontal plane, so that the workpiece carrier means moves along a trajectory which is located within a rotational trajectory of the rotatable drum means and overlaps with the rotational trajectory in vicinities of the pick-up position and the installation position.

4. The workpiece installation apparatus of claim 1, further comprising means for controlling a spinning motion of the workpiece carrier means such that an orientation of the workpiece carried by the workpiece carried means remains unchanged from an orientation in which the workpiece is picked up by the workpiece carrier means at the workpiece supply station.

5. The workpiece installation apparatus of claim 1, wherein one of a rotational radius ratio of a radius of rotation of the rotatable drum means with respect to a radius of spinning workpiece carrier means and an angular velocity ratio of a rotational angular velocity of the rotatable drum means and a spinning angular velocity of the workpiece carrier means is deviated from a state in which the rotational radius ratio and the rotational angular velocity ratio are equal, such that a vertical stroke of the workpiece carrier means at the pick-up and installation positions becomes longer.

6. The workpiece installation apparatus of claim 1, further comprising:
rotation phase detection means for detecting a rotational phase of the rotatable drum means; and
spinning phase detection means for detecting a spinning phase of the workpiece carrier means;
and wherein the control means controls the workpiece carrier means according to a difference between the detected rotational phase and spinning phase.

7. The workpiece installation apparatus of claim 1, wherein the prescribed trajectory of the workpiece carrier means is a cycloidal trajectory.

8. The workpiece installation apparatus of claim 1, wherein the prescribed trajectory of the workpiece carrier means is a quasi-cycloidal trajectory.

9. A method of workpiece installation, comprising the steps of:
continuously rotating drum means in a horizontal plane around a fixed axis;
mounting workpiece carrier means to a circumference of the rotatable drum means, for carrying a workpiece from a workpiece supply station to a workpiece installation station, with the workpiece carrier means capable of spinning in a plane at least substantially perpendicular to the horizontal plane on the circumference while carrying the workpiece in a vertical trajectory;
controlling the workpiece carrier means such that the workpiece carrier means spins while the rotatable drum means rotates so as to move along a prescribed trajectory, and such that the workpiece is picked up by the workpiece carrier means at a prescribed pick-up position on the workpiece supply station and released at a prescribed installation position on the workpiece installation station, wherein the pick-up position and the installation position are located at vertical levels near lowest positions in the prescribed trajectory.

10. The workpiece installation method of claim 9, further comprising the step of sliding the workpiece carrier means along a diameter of the rotatable drum means such that the workpiece carrier means moves within a rotational trajectory of the rotatable drum means.

11. The workpiece installation method of claim 9, wherein the workpiece carrier means is mounted on the circumference such that a spinning axis of the workpiece carrier means is inclined by a prescribed angle with respect to the horizontal plane, so that the workpiece carrier means moves along a trajectory which is located within a rotational trajectory of the rotatable drum means and overlaps with the rotational trajectory in vicinities of the pick-up position and the installation position.

12. The workpiece installation method of claim 9, further comprising the step of controlling a spinning motion of the workpiece carrier means such that an orientation of the workpiece carried by the workpiece carrier means remains unchanged from an orientation in which the workpiece is picked up by the workpiece carrier means at the workpiece supply station.

13. The workpiece installation method of claim 9, wherein one of a rotational radius ratio of a radius of rotation of the rotatable drum means with respect to a radius of spinning workpiece carrier means and an angular velocity ratio of a rotational angular velocity of the rotatable drum means and a spinning angular velocity of the workpiece carrier means is deviated from a state in which the rotational radius ratio and the rotational angular velocity ratio are equal, such that a vertical stroke of the workpiece carrier means at the pick-up and installation positions becomes longer.

14. The workpiece installation method of claim 9, further comprising the steps of:
detecting a rotational phase of the rotatable drum means; and
detecting a spinning phase of the workpiece carrier means;
and wherein at the controlling step the workpiece carrier means is controlled according to a difference between the detected rotational phase and spinning phase.

15. The workpiece installation method of claim 9, wherein the prescribed trajectory of the workpiece carrier means is a cycloidal trajectory.

16. The workpiece installation method of claim 9, wherein the prescribed trajectory of the workpiece carrier means is a quasi-cycloidal trajectory.

* * * * *

UNITED STATES PATENT AND TRADEMARK OFFICE
CERTIFICATE OF CORRECTION

PATENT NO. : 5,234,304
DATED : August 10, 1993
INVENTOR(S) : Yutaka Okumoto et al.

It is certified that error appears in the above-indentified patent and that said Letters Patent is hereby corrected as shown below:

On the title page, Item [75],

The eleventh inventor's last name, should read: --Munakata--

Signed and Sealed this

Fifteenth Day of March, 1994

Attest:

BRUCE LEHMAN

*Attesting Officer*     *Commissioner of Patents and Trademarks*